United States Patent
Lehn

(10) Patent No.: US 12,473,646 B2
(45) Date of Patent: Nov. 18, 2025

(54) METHODS FOR DEPOSITING CARBON CONDUCTING FILMS BY ATOMIC LAYER DEPOSITION

(71) Applicant: Micron Technology, Inc., Boise, ID (US)

(72) Inventor: Jean-Sebastien Materne Lehn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 490 days.

(21) Appl. No.: 17/957,593

(22) Filed: Sep. 30, 2022

(65) Prior Publication Data
US 2024/0124977 A1 Apr. 18, 2024

(51) Int. Cl.
*C23C 16/455* (2006.01)
*C01B 32/05* (2017.01)
*C23C 16/26* (2006.01)

(52) U.S. Cl.
CPC ........ *C23C 16/45553* (2013.01); *C01B 32/05* (2017.08); *C23C 16/26* (2013.01); *C23C 16/45527* (2013.01); *C01P 2006/40* (2013.01)

(58) Field of Classification Search
None
See application file for complete search history.

(56) References Cited

U.S. PATENT DOCUMENTS

2016/0133460 A1* 5/2016 Thompson ........ C23C 16/45531
438/786

OTHER PUBLICATIONS

Frisch et al., Acetylenic silicon derivatives, Journal of the American Chemical Society (1952), 74, 4853-6.
Vihervaara et al., A low-temperature thermal ALD process for nickel utilizing dichlorobis(triethylphosphine)nickel(II) and 1,4-bis(trimethylgermyl)-1,4-dihydropyrazinet, The Royal Society of Chemistry, Dalton Trans., 2022, 51, 10898-10908.
Strem Chemicals, Inc., Bis(trimethyltin)acetylene, 99%, 50-0900 datasheet, Jul. 18, 2021.
Gelest Inc., Bis(Trimethylsilyl)Butadiyne, SIB1854.0 datasheet, Sep. 30, 2016.
Gelest Inc., Bis(Trimethylsilyl)Acetylene, SIB1850.0 datasheet, Dec. 28, 2015 (revised Apr. 12, 2019).

* cited by examiner

*Primary Examiner* — Mandy C Louie
(74) *Attorney, Agent, or Firm* — Holland & Hart LLP

(57) ABSTRACT

Methods, systems, and devices for depositing carbon conducting films by atomic layer deposition are described. For instance, a device may react a first precursor with a base material to form a carbon compound on a material, where the first precursor is an acetylene, a diacetylene, a triacetylene, a polyacetylene, an alkene, or an arene and includes at least one germanium, silicon, or tin. Additionally, the device may react a second, carbon-containing precursor with the carbon compound to form a layer on the base material.

18 Claims, 6 Drawing Sheets

METHODS FOR DEPOSITING CARBON CONDUCTING FILMS BY ATOMIC LAYER DEPOSITION

FIELD OF TECHNOLOGY

The following relates to methods for performing atomic layer deposition, including methods for depositing carbon conducting films by atomic layer deposition.

BACKGROUND

Atomic layer deposition (ALD) is a technique used to deposit a film on a first material. For instance, performing ALD may include exposing the first material to a first precursor to form a second material on the first material. Additionally, performing ALD may include exposing the second material to a second precursor, where the second precursor may react with the second material to leave a third material on the surface of the first material. In some examples, the process may repeat, where the third material may be exposed to the first precursor to form another instance of the second material on the third material, and then the other instance of the second material may be exposed to the second precursor to leave another instance of the third material on the surface of the previously formed instance of the third material.

In some examples, reactions involved in ALD may occur at various temperatures. However, if such temperatures are outside of a predefined range for a threshold duration, other materials in a vicinity to the material being exposed to ALD may experience a change in physical or chemical properties beyond an expected threshold. Such changes in physical or chemical properties may adversely affect an operation of an electronic device that includes these other materials (e.g., may decrease a lifetime of the electronic device, may increase a likelihood that the electronic device displays errant behavior or does not perform its intended function). For some materials, the temperature in order to facilitate reactions (e.g., for forming the third material) in ALD may exceed the predefined range for the threshold duration. Accordingly, materials whose reactions may be facilitated to be within the predefined range or to be outside of the predefined range for less than the predefined duration, may decrease a likelihood that the operation of the electronic device is adversely affected.

DETAILED DESCRIPTION

An electronic device may be made up of layers of materials. One technique for adding layers to the electronic device is to perform ALD. In some examples, it may be advantageous for one or more of those layers to be made up of carbon with a purity above a threshold amount (e.g., 85% pure carbon, 90% pure carbon, 95% pure carbon, 99% pure carbon, 99.9% pure carbon). For instance, carbon with the purity above the threshold amount may have conductive properties that may enhance the operation of the electronic device (e.g., such carbon may have a higher conductivity as compared to other materials). However, previously disclosed precursors used in ALD have not been shown to be capable of producing such carbon. Instead, these previously disclosed precursors deposit other elements or compounds with the carbon.

The techniques disclosed herein describe precursors capable of being used in ALD to produce one or more layers of carbon with the purity above the threshold amount for an electronic device. For instance, the techniques may include exposing a material (e.g., a base material) to a first precursor and reacting the first precursor with the material to form a first carbon compound, where the first precursor may be an acetylene, a diacetylene, a tri-acetylene, a polyacetylene, an alkene, or an arene and may include at least one of germanium, silicon, or tin. Additionally, the techniques may include reacting a second, carbon-containing precursor with the carbon compound to form a layer of carbon on the material.

Additionally or alternatively, the precursors disclosed herein may enable lower temperatures to be used for forming a layer of carbon on a material. For instance, the reactivity of germanium, silicon, or tin may be such that the layer of carbon can be formed at a lower temperature when reacting the second, carbon-containing precursor with the carbon compound, as the carbon compound may include the germanium, silicon, or tin. Additionally or alternatively, in some examples, the reactivity of germanium and tin may be higher than that of silicon such that the layer of carbon may be formed at lower temperatures using germanium or tin in the first precursor as compared to examples of the first precursor that do not contain the germanium or the tin.

Features of the disclosure are initially described in the context of an ALD process and a material formation process as described with reference to FIGS. 1 and 2. Features of the disclosure are described in the context of an electronic device as described with reference to FIG. 3. These and other features of the disclosure are further illustrated by and described with reference to an apparatus diagram and flowcharts that relate to methods for depositing carbon conducting films by atomic layer deposition as described with reference to FIGS. 4 through 6.

Figure 1:
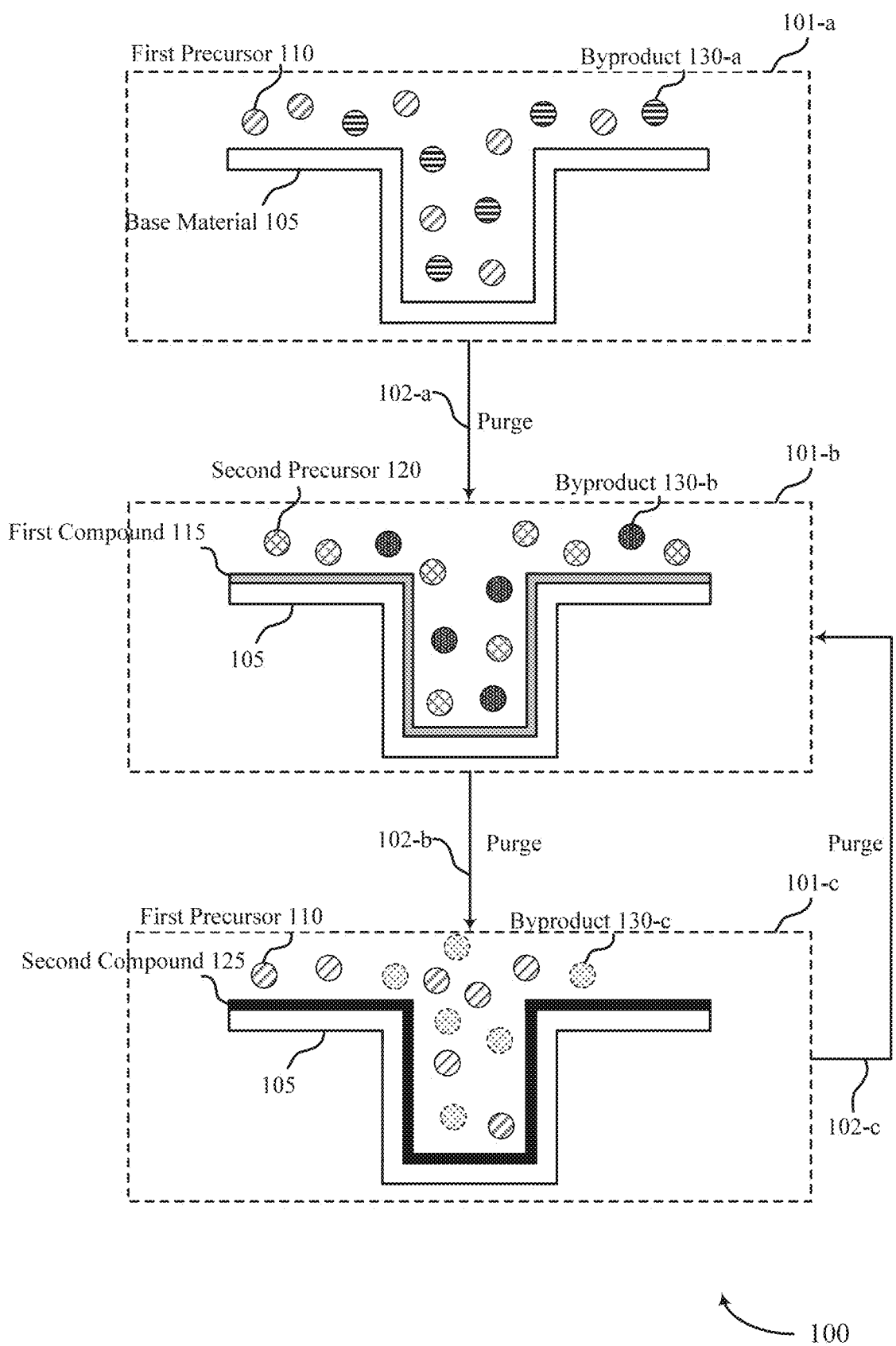
FIG. 1 illustrates an example of an atomic layer deposition (ALD) process that supports methods for depositing carbon conducting films by atomic layer deposition in accordance with examples as disclosed herein.

FIG. 1 illustrates examples of an ALD process 100 that supports methods for depositing carbon conducting films by atomic layer deposition in accordance with examples as disclosed herein.

As illustrated in stage 101-*a*, a base material 105 may be exposed to a first precursor 110. For instance, the base material 105 may be located in a reactor (e.g., deposition chamber) within which a gaseous phase of the first precursor 110 may be introduced. Exposing the base material to the first precursor may enable a first compound 115 to form on the surface of the base material 105, as depicted in stage 101-b. In some examples, as a result of the reaction between base material 105 and first precursor 110, a byproduct 130-a will be formed. After forming first compound 115, a byproduct 130-a may be formed; in that case, the by-product 130-a and/or a portion of the first precursor 110 may be purged (e.g., removed from the reactor) at 102-a before proceeding to stage 101-b. In some examples, the temperature of the reactor may be set or adjusted to a first predefined value such that the first compound 115 forms on the surface of the base material 105. In some examples, the base material may be a substrate. In some examples, exposing a material to a precursor may refer to adding the precursor to the reactor within which the material is located, whereas reacting the material with the precursor may refer to a chemical reaction that occurs between the precursor and the material and may involve setting or adjusting a temperature of the reactor to a particular temperature that facilitates the reaction.

After forming the first compound 115 at stage 101-a, the first compound 115 may be exposed to a second precursor 120 at stage 101-b. For instance, a gaseous phase of the second precursor 120 may be introduced into the reactor and exposed to the surface of the first compound 115. In some examples, the base material 105 may be transported to a second reactor for introducing the second precursor 120. In other examples, the same reactor may be used. The second precursor 120 may react with the first compound 115 to form a second compound 125, as shown in stage 101-b. In some examples, as a result of the reaction between first compound 115 and second precursor 120, a byproduct 130-b will be formed. After forming second compound 125, the byproduct 130-b and/or at least a portion of the second precursor 120 may be purged (e.g., removed from the reactor) at 102-b before proceeding to stage 101-c. In some examples, the temperature of the reactor may be set or adjusted to a second predefined value such that the second compound 125 forms on the surface of the base material 105.

After forming the second compound 125 at stage 101-b, the second compound 125 may be exposed to a first precursor 110 at stage 101-c. For instance, a gaseous phase of the first precursor 110 may be introduced to the reactor and exposed to the surface of the second compound 125. In some examples, the base material 105 may be transported to a third reactor for introducing the first precursor 110. In other examples, the same reactor may be used for stage 101-c as used for one or both of stages 101-a and 101-b. The first precursor 110 may react with the second compound 125 to form a second instance of the first compound 115 on top of the second compound 125. In some examples, as a result of the reaction between second compound 125 and first precursor 110, a byproduct 130-c will be formed. After forming the second instance of first compound 115, the byproduct 130-c and/or at least a portion of the first precursor 110 may be purged (E.g., removed from the reactor) at 102-c before returning back to stage 101-b. In some examples, the temperature of the reactor may be set or adjusted to the first predefined value or a third predefined value such that the first compound 115 forms on the surface of the base material 105. In some examples, first precursor 110 and second precursor 120 may be delivered to the reactor (e.g., or reactors) using an inert gas (e.g., argon, helium, nitrogen). Additionally or alternatively, the byproducts 130-a, 130-b and/or 130-c may be purged using an inert gas (e.g., argon, helium, nitrogen).

In some examples, the process may be repeated to deposit multiple layers of the second compound 125. For instance, after depositing a first instance of second compound 125, the first instance of the second compound 125 may be exposed to the first precursor 110 to form a second instance of the first compound 115 on a surface of the first instance of the second compound 125. Then, the second instance of the first compound 115 may be exposed to the second precursor 120 to form a second instance of the second compound 125 on the surface of the first instance of the second compound 125.

In some examples, the first precursor 110 may be an acetylene, a diacetylene, a tri-acetylene, a polyacetylene, an alkene, or an arene and may include at least one of germanium, silicon, or tin. Additionally or alternatively, the second precursor 120 may be carbon-containing. Using these precursors, a layer of carbon (e.g., carbon with above 85% purity, carbon with above 90% purity, carbon with above 95% purity, carbon with above 99% purity, carbon with above 99.9% purity) may be deposited as the second compound 125.

It should be noted that there may be examples in which the second precursor 120 may react with the base material 105 to form a third compound. In some such examples, the first precursor 110 may react with the third compound to form a fourth compound. The process may be repeated and such that multiple layers of carbon (e.g., carbon with above 85% purity, carbon with above 90% purity, carbon with above 95% purity, carbon with above 99% purity, carbon with above 99.9% purity) may form.

In some examples, the base material 105 may be a structure on a substrate (e.g., a wafer). In some such examples, the base material 105 may span in a first direction and a second direction, where the first direction is orthogonal to the second direction. Additionally, a memory device including the base material 105 may include word lines extending along the first direction and/or the second direction and bit lines extending along a third direction orthogonal to the first direction and the second direction. In some such examples, a stack of materials (e.g., a sequence of materials) may be formed in one or more recesses of the word lines, where the stack may extend along the first direction and/or the second direction and where the sequence of materials may include a memory cell (e.g., a chalcogenide element). In some examples, the techniques described herein may be used to form layers of carbon on the base material 105, the word lines, the bit lines, the stacks, or any combination thereof.

Figure 2:
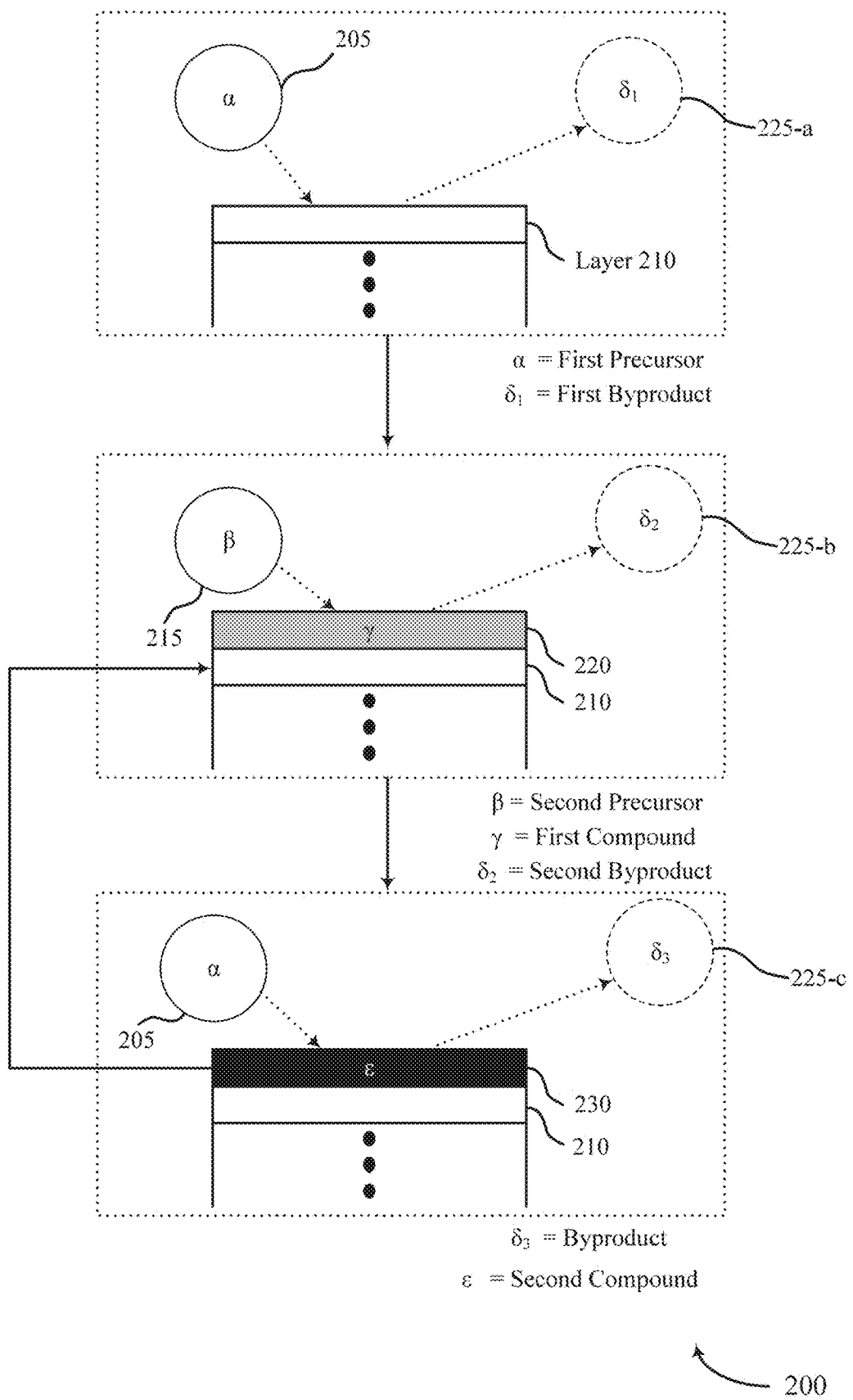
FIG. 2 illustrates an example of a material formation process that supports methods for depositing carbon conducting films by atomic layer deposition in accordance with examples as disclosed herein.

FIG. 2 illustrates an example of a material formation process 200 that supports methods for depositing carbon conducting films by atomic layer deposition in accordance with examples as disclosed herein.

As illustrated in FIG. 2, a layer 210 may be exposed to a first precursor 205. The first precursor, for instance, may be an acetylene, a diacetylene, a tri-acetylene, a polyacetylene, an alkene, or an arene and may include at least one of germanium, silicon, or tin. In some examples, the first precursor 205 reacting with the layer 210 may form a byproduct 225-a, which may be removed from the reactor. After forming the first compound 220, the first compound 220 may be exposed to a second precursor 215, where the second precursor may contain carbon. The second precursor 215 may react with the first compound 220 to form second compound 230, which may be a layer of carbon (e.g., carbon with above 85% purity, carbon with above 90% purity, carbon with above 95% purity, carbon with above 99% purity, carbon with above 99.9% purity). In some examples, the second precursor 215 may form a layer on the first compound 220 and the layer may react with the first compound 220 to form the second compound 230. In other examples, the second precursor 215 may directly react with the first compound 220 to form the second compound 230. This reaction may produce a byproduct 225-b, which may be removed from the reactor.

In some examples, the second compound 230 may be exposed to a first precursor 205 to form a second instance of the first compound on the second compound 230. In some examples, the first precursor may form a layer on the second compound 230 and the layer may react with the second compound 230 to form the second instance of the first compound. In other examples, the first precursor 205 may directly react with the second compound 230 to form the second instance of the first compound. This reaction may produce a byproduct 225-c, which may be removed from the reactor. Without deviating from the scope of the disclosure, the second instance of the first compound may instead be a third compound distinct from the first compound. In some examples, the process may be repeated to deposit multiple layers of the second compound 230. For instance the process may repeat again where the second instance of the first compound acts as depicted first compound 220 and second compound 230 acts as layer 210. In some examples, first precursor 205 and second precursor 215 may be delivered to the reactor (e.g., or reactors) using an inert gas (e.g., argon, helium, nitrogen). Additionally or alternatively, the byproducts 225-a, 225-b, and/or 225-c may be purged using an inert gas (e.g., argon, helium, nitrogen).

In a first example, the first compound 220 may include -Sub-(-CC—SiMe$_3$)$_n$ bonded with a substrate and the second precursor 215 may include n moles of CBr$_4$, where n may be 2 or 3, for instance, although n may also have other values. Additionally, Sub may represent the substrate, CC may represent two triple-bonded carbons, Si may represent Silicon, Me may represent methyl, C may represent carbon, and Br may represent bromine. In such examples, the first compound 220 and the second precursor 215 may react to form a second compound 230 that includes the substrate and -Sub-(-CC—SiMe$_3$)$_n$ and will also form a byproduct 225-b that includes n moles of Br—SiMe$_3$. For instance, CBr$_3$ may replace the SiMe$_3$ of the first compound 220. Additionally, first precursor 205 may be Me$_3$Si—CC—SiMe$_3$ and may react with the CBr$_n$ (e.g., CBr$_3$) of the second compound 230. In such examples, the —CC—SiMe3 of the first precursor 205 may replace the Br of the -Sub-(-CC—CBr$_3$)$_n$ to form an additional layer of carbon (e.g., -Sub-(-CC—C—{CC—SiMe$_3$}$_3$)$_n$ bonded with the substrate may be formed). Additionally, the byproduct 225-c will be produced and may have the chemical formula Br—SiMe$_3$. Other byproducts 225-b and 225-c (e.g., {MeO—SiMe$_3$}, {Me$_2$N—SiMe$_3$}, {Br—GeMe$_3$}, {Br—SnMe$_3$}, {Br—SiEt$_3$}, {Cl—SiMe$_2$-SiMe$_3$}) may be obtained by using other compounds.

In some examples, the first precursor 205 may include at least one alkyne group (e.g., an acetylene) and may be defined as the chemical formula R$_1$R$_2$R$_3$A-CC—ZR$_4$R$_5$R$_6$, where A or Z are independently selected from germanium, tin, or silicon, where CC represents two carbons triple bonded with each other, and where each of R$_1$, R$_2$, R$_3$, R$_4$, R$_5$, and R$_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. In some examples, an alkyne group may be defined as a compound that has at least one pair of triple-bonded carbons. Additionally or alternatively, each of R$_1$, R$_2$, R$_3$, R$_4$, R$_5$, and R$_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of R$_1$, R$_2$, R$_3$, R$_4$, R$_5$, and R$_6$ may be independently selected from a —SiR$_a$R$_b$R$_c$ moiety, a —GeR$_a$R$_b$R$_c$ moiety, a —SnR$_a$R$_b$R$_c$ moiety, a —SiR$_a$R$_b$C$_c$R$_d$R$_e$ moiety, a —CR$_a$R$_b$SiR$_c$R$_d$R$_e$ moiety, a —SiR$_a$R$_b$GeR$_c$R$_d$R$_e$ moiety, or more generally a moiety containing a set of carbon atoms, silicon atoms, germanium atoms, tin atoms, or any combination thereof. For instance, each atom of the set of carbon atoms, silicon atoms, germanium atoms, tin atoms, or any combination thereof is fully saturated with respective substituents so that each of these (carbon, silicon, germanium, or tin) atoms has 4 bonds, which can either be to other (carbon, silicon, germanium, or tin) atoms of the set or to corresponding substituents represented as R$_a$ through R$_x$ (where the substituents may be indexed as a, b, c ..., x, where x is some index different than a). In some such examples, up to 10 atoms of Carbon, Silicon, Germanium, or Tin may be included in the set that are distinct from any atoms of Carbon, Silicon, Germanium, or Tin of the R$_a$ through R$_x$ substituents. Additionally, the set of carbon atoms, silicon atoms, germanium atoms, tin atoms, or any combination thereof may be linear, branched, or cyclic. In some examples, R$_a$ through R$_x$ may be independently selected from hydrogen (or deuterium), an alkyl group, an aryl group, an alkoxy, a di-alkylamide, an amide with an alkyl and a silyl substituent or group (e.g., the silyl group has hydrogen, deuterium or alkyl substituents), an amide with two silyl substituents or groups (e.g., the silyl groups have hydrogen, deuterium or alkyl substituents), an amide with an alkyl and a germyl substituent or group (e.g., the germyl group has hydrogen, deuterium or alkyl substituents), a tri-alkylhydrazide, a hydrazide with a combination of three substituents or groups which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, the first precursor 205 as described herein may have the following form.

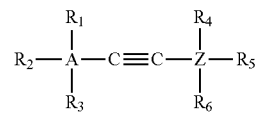

In some examples, the first precursor 205 may be a diacetylene and may be defined as the chemical formula R$_1$R$_2$R$_3$A-CC—CC—ZR$_4$R$_5$R$_6$, where A or Z are independently selected from germanium, tin, or silicon, where each CC is two carbons triple bonded with each other, and where R$_1$, R$_2$, R$_3$, R$_4$, R$_5$ and R$_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, the first precursor 205 may be a tri-acetylene and may have the chemical formula $R_1R_2R_3A$-CC—CC—CC—$ZR_4R_5R_6$. In some examples, the first precursor 205 may be a polyacetylene and may have the chemical formula $R_1R_2R_3A$-$(CC)_n$—$ZR_4R_5R_6$, where n is an integer larger than 3. In some examples, the first precursor 205 as described herein may have the following form:

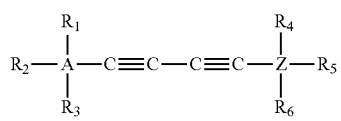

In some examples, the first precursor 205 may be an alkene and may be defined as the chemical $(R_1R_2R_3A_1)$ $(R_4R_5R_6A_2)$-C=C—$(Z_1R_7R_8R_9)(Z_2R_{10}R_{11}R_{12})$, $(R_1R_2R_3A_1$-CC)$(R_4R_5R_6A_2)$-C=C—$(Z_1R_7R_8R_9)$ $(Z_2R_{10}R_{11}R_{12})$, $(R_1R_2R_3A_1$-CC)$(R_4R_5R_6A_2)$-C=C—$(CC$—$Z_1R_7R_8R_9)(Z_2R_{10}R_{11}R_{12})$, $(R_1R_2R_3A_1$-CC) $(R_4R_5R_6A_2)$-C=C—$(CC$—$Z_1R_7R_8R_9)(CC$—$Z_2R_{10}R_{11}R_{12})$, $(R_1R_2R_3A_1$-CC)$(R_4R_5R_6A_2$-CC)—C=C—$(CC$—$Z_1R_7R_8R_9)(CC$—$Z_2R_{10}R_{11}R_{12})$, or $(R_1R_2R_3A_1$-CC) $(R_4R_5R_6A_2$-CC)—C=C—$(Z_1R_7R_8R_9)(Z_2R_{10}R_{11}R_{12})$, where $A_1$, $A_2$, $Z_1$, or $Z_2$ are independently selected from a germanium, a tin, or a silicon, where C=C is two carbons double bonded with each other and CC is two carbons triple-bonded with each other, and where each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_b$-$SiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. For instance, the first precursor 205 as described herein may have the following form:

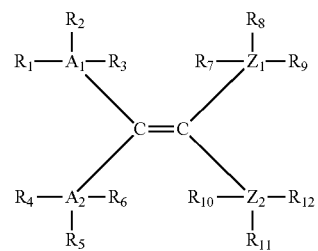

In some examples, the first precursor 205 may be an alkene and may be defined as the chemical formula $R_1R_2R_3A$-$CD_1$=$CD_2$-$ZR_4R_5R_6$, $R_1R_2R_3A$-CC- $CD_1=CD_2-ZR_4R_5R_6$, or $R_1R_2R_3A$-CC-$CD_1=CD_2$-CC—$ZR_4R_5R_6$, where A or Z are independently selected from a germanium, a tin, or a silicon, CC is two carbons triple bonded with each other; C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy; and each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, $D_2$ includes the chemical formula $R_7R_8R_9A_2$, where $A_2$ is selected from a germanium, a tin, or a silicon, and where each of $R_7$, $R_8$, and $R_9$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_7$, $R_8$, and $R_9$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, and $R_9$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, or all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, the first precursor 205 as described herein may have the following form:

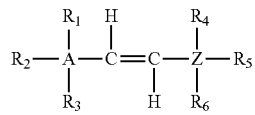

In some examples, the first precursor 205 may be an arene and may be defined as the chemical formula $R_1R_2R_3A$-$C_6Y_1Y_2Y_3Y_4$—$ZR_4R_5R_6$, $R_1R_2R_3A$-CC—$C_6Y_1Y_2Y_3Y_4$—$ZR_4R_5R_6$, $R_1R_2R_3A$-CC—$C_6Y_1Y_2Y_3Y_4$—CC—$ZR_4R_5R_6$, where CC is two carbons triple-bonded with each other, each of A or Z are independently selected from a germanium, a tin, or a silicon; C is a carbon, where $Y_1$, $Y_2$, $Y_3$, and $Y_4$ are each independently selected from hydrogen (or deuterium), methyl, ethyl, propyl, isopropyl, an alkyl, an aryl, a linear alkoxy, a branched alkoxy, or a hexyl alkoxy, and where each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, $Y_1$ includes the chemical formula $R_7R_8R_9A_2$, or $R_7R_8R_9A_2$-CC; $Y_2$ includes the chemical formula $R_{10}R_{11}R_{12}A_3$, or $R_{10}R_{11}R_{12}A_3$-CC; $Y_3$ includes the chemical formula $R_{13}R_{14}R_{15}A_4$, or $R_{13}R_{14}R_{15}A_4$-CC; $Y_4$ includes the chemical formula $R_{16}R_{17}R_{18}A_5$, or $R_{16}R_{17}R_{18}A_5$-CC; or any combination thereof, where $A_2$, $A_3$, $A_4$, $A_5$ are independently selected from a germanium, a tin, or a silicon, and where $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride, and where CC are two triple-bonded carbons with each other. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. In some examples, the first precursor 205 as described herein may have the following form.

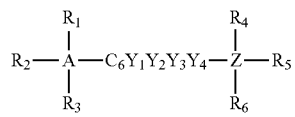

In some examples, the second, carbon-containing precursor 215 may be defined as chemical formula $CX_1X_2X_3X_4$, or $W_1{=}CX_3X_4$, or $W_1{=}C{=}W_2$, or $NCX_3$, where each of $X_1$, $X_2$, $X_3$, and $X_4$ are independently selected from fluoride, chloride, bromide, iodide, cyanide, a methoxy, an ethoxy, an alkoxy, an alkyl-sulfide, an alkyl-selenide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate, a dimethylamide, a diethylamide, an ethylmethylamide, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), hydrogen (or deuterium) or an alkyl, or an aryl, or an alkyl containing double or triple carbon-carbon bonds, or any combination thereof. Additionally, $W_1$ and $W_2$ are independently selected from oxygen, sulfur, selenium, or tellurium; examples of molecules containing $W_1$ and $W_2$ can be O=$CCl_2$, O=C=S, or S=C=S. N is nitrogen; examples of molecules containing N can be NCBr, cyanogen bromide. In some examples, the second, carbon-containing precursor 215 may be a tetramethylorthocarbonate (e.g., $C(OMe)_4$, where Me is a methyl), a tetraethylorthocarbonate (e.g., $C(OEt)_4$, where Et is an ethyl), a tetrakis(dimethylamino) methane (e.g., $C(NMe_2)_4$,) a tetrakis(diethylamino)methane (e.g., $C(NEt_2)_4$,), or a tetrakis(ethylmethylamino)methane (e.g., $C(NMeEt)_4$,). One example of a reaction of second, carbon-containing precursor 215 may be given as $CBr_4$ + $4Me_3Si{-}CC{-}SiMe_3 \rightarrow C(CC{-}SiMe_3)_4 + 4BrSiMe_3$. In that case, the by-product 225-$b$ will be $BrSiMe_3$. In cases the second, carbon containing precursor contains an atom $W_n$ (n=1 or 2), the by-product 225-*b* will be Me$_3$Si—W$_n$—SiMe$_3$, for example hexamethyldisiloxane, Me$_3$Si—O—SiMe$_3$. In cases the second, carbon containing precursor contains an atom N the by-product 225-*b* will be N(SiMe$_3$)$_3$, tris(trimethylsilyl)amine. In some examples, the second, carbon-containing precursor 215 may have the following form:

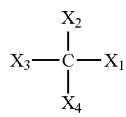

In some examples, the second, carbon-containing precursor 215 may include a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. In some additional examples, the second, carbon-containing precursor 215 may include an carboxylic acid halide, an halogenated carboxylic acid halide, a perhalogenated carboxylic acid halide, a di(carboxylic acid)di-halide, chloral. Examples of, respectively, each of these families can be formic acid chloride, HCOCl; chloroacetic acid chloride, ClCH$_2$—COCl; trifluoracetic acid chloride, CF$_3$—COCl; oxalic acid dichloride, ClOC—COCl; chloral, CCl$_3$—CHO. In more additional examples, the second, carbon-containing precursor 215 may include an carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, ClCH$_2$—COOH; trifluoracetic acid, CF$_3$—COOH; oxalic acid, HOOC—COOH; oxalic acid chloride, HOOC—COCl.

In some examples, the first precursor 205 may be reacted with the base material and/or the second carbon-containing precursor may be reacted with the first compound 220 to form the layer of carbon (e.g., second compound 230) at a temperature at or below 500° C. Performing the reaction at this temperature may be possible due to a reactivity of the silicon, germanium, or tin in the first precursor 205 and/or the first compound 220. Additionally or alternatively, the temperature may be at or below 400° C. Performing the reaction at this temperature may be possible due to a reactivity of the germanium or tin in the first precursor 205 and/or the first compound 220 (e.g., as compared to a first precursor 205 and/or a first compound 220 that includes silicon instead of germanium or tin).

In some examples, the term 'alkyl' may refer to a saturated hydrocarbon chain, an unsaturated hydrocarbon chain, a linear hydrocarbon chain, a branched hydrocarbon chain, or a cyclic hydrocarbon chain including from one carbon atom (e.g., C$_1$) to ten carbon atoms (e.g., C$_{10}$).

In some examples, the term "substituted" may refer to a functional group where one or more hydrogen atoms have been replaced by another functional group, such as an alkyl group, an alkoxide group, an amide group, an amine group, or a halogen group.

In some examples, a "halide" may refer to a fluoro, a chloro, a bromo, or an iodo.

In some examples, the term "alkoxy" may refer to an alkyl group linked to an oxygen atom including, but not limited to, a methoxy group, an ethoxy group, a propoxy group, a butoxy group, a pentoxy group, a hexoxy group, a heptoxy group, an octoxy group, a nonoxy group, a decoxy group, a phenyloxide, an aryloxide, an alkylsilyoxide, an alkoxy-substituted alkoxy group (e.g., a polyether group), such as a methoxy group, a methoxy ethoxy group, an ethoxy methoxy group, an ethoxy group, and a methoxy ethoxy group. The alkoxy may be linear or branched, such as iso-propylalkoxide or a tert-butylalkoxide. The alkoxy may have a chelating group. Chelating groups may, for instance, refer to a dialkylamido group or an alkylsulfide group.

In some examples, a "methyl" may refer to a compound with the chemical formula CH$_3$, where "C" may refer to carbon and "H" may refer to hydrogen (or deuterium). In some examples, an "ethyl" may refer to a compound with the chemical formula CH$_2$CH$_3$. In some examples, a "propyl" may refer to a compound with the chemical formula CH$_2$CH$_2$CH$_3$. In some examples, an "isopropyl" may refer to a compound with the chemical formula (CH$_3$)$_2$CH—. In some examples, an alkyl group may refer to a compound with a chemical formula C$_n$H$_{2n+1}$, where n is an integer greater than or equal to 1. In some examples, an alkyl-sulfide may refer to a —SR moiety, where R is an alkyl group, an alkyl-selenide may refer to a —SeR moiety, where R is an alkyl group, an alkyl-telluride may refer to a —TeR moiety, where R is an alkyl group. In some examples, a dialkylamide may refer to an amide moeity with two alkyl groups, such as —NR'R", where R' and R" are alkyl groups.

A dimethylamino is the moiety with chemical formula (CH$_3$)$_2$N—, where "C" may refer to carbon, "H" may refer to hydrogen (or deuterium), and "N" may refer to nitrogen. In some examples, a diethylamino is the moiety with chemical formula (CH$_2$CH$_3$)$_2$N—. In some examples, ethylmethylamino is the moiety with chemical formula CH$_2$CH$_3$(CH$_3$)N—.

In some examples, the methods or aspects of the methods described herein may be performed using chemical vapor deposition (CVD). For instance, the first precursor 205 may be deposited using CVD and the second precursor may react with the first compound 220 via the methods described herein, the first compound 220 may be formed with the first precursor 205 via the methods described herein and the second precursor 215 may be deposited onto the first compound 220 using CVD, or the first precursor 205 and the second precursor 215 may both be deposited using CVD.

Independently including or selecting from a set of elements and/or compound may refer to a capability that a first element or compound may be substituted for another while still producing a precursor usable for forming a compound on a surface of a material.

It should be noted that there may be examples in which the second, carbon-containing precursor 215 may react with the layer 210 to form a third compound. In some such examples, the first precursor 205 may react with the third compound to form a fourth compound. The process may be repeated and such that multiple layers of carbon (e.g., carbon with above 85% purity, carbon with above 90% purity, carbon with above 95% purity, carbon with above 99% purity, carbon with above 99.9% purity) may form.

While the second compound 230 (e.g., carbon or a carbon material) may be formed by sequentially introducing and reacting the first precursor 205 and the second precursor 215 (i.e., in an ABAB . . . sequence), the precursors may be introduced in a different order than that described above (e.g., in a BABA . . . sequence, an AABAAB . . . sequence, an ABBABB sequence) depending on the composition of the second compound 230. For instance, first precursor 205 may be introduced followed by the introduction of the second precursor 215. Depending on the composition of the second compound 230, more than one introduction (e.g., pulse) of the first precursor 205 or the second precursor 215 may be conducted before the second precursor 215 or the first precursor 205, respectively, are introduced.

In some examples, a first molecule for the first precursor 205 (i.e., precursor 1-*a*) and a second molecule for the second precursor 215 (i.e., precursor 2-*a*) may be introduced repeatedly for one or more cycles (e.g., AA times or AA cycles, where AA is some positive integer). After repeatedly introducing precursor 1-*a* and precursor 2-*a* over the multiple cycles, a third molecule for the first precursor 205 (i.e., precursor 1-*b*) and a fourth molecule for the second precursor (i.e., precursor 2-*b*) may be introduced repeatedly for one or more cycles (e.g., BB times or BB cycles, where BB is some positive integer). This process may continue for multiple other precursors up to a predefined amount (e.g., CC times or CC cycles for precursors 1-*c* and 2-*c*, DD times or DD cycles for precursors 1-*d* and 2-*d*, and so on, up to XX times or XX cycles for precursors 1-*x* and 2-*x*, where CC, DD, and XX are all positive integers). After this process continues up to the predefined amount, the process may repeat (e.g., precursors 1-*a* and 2-*a* may be used again for AA times or AA cycles). It should be noted that each of the molecules used as precursors for each cycle may be selected from the same molecule relative to a different cycle or different molecules from the molecules described herein for first precursor 205 and second precursor 215.

In some such examples, a third precursor may be reacted with a layer of carbon (e.g., second compound 230) to form a second carbon compound on the layer of carbon, where the third precursor is an acetylene, a diacetylene, a tri-acetylene, a polyacetylene, an alkene, or an arene and includes at least one of germanium, silicon, or tin. Additionally, a fourth, carbon-containing precursor may be reacted with the second carbon compound to form a second layer of carbon on the layer of carbon (e.g., on second compound 230). In some such examples, a set of X precursor pairs may be identified, where each precursor pair of the set of X precursor pairs includes one of a first set of precursors and one of a second set of precursors, where each precursor pair has an associated quantity of cycles, where X is an integer greater than or equal to 2, where each precursor of the first set of precursors is independently selected from an acetylene, a diacetylene, a tri-acetylene, a polyacetylene, an alkene, or an arene and includes at least one of germanium, silicon, or tin, and where each precursor of the second set of precursors is a carbon-containing precursor. Additionally, according to the associated quantity of cycles for each precursor pair of the set of X precursor pairs and to form a respective carbon film associated with the precursor pair, a reacting of the one of the first set of precursors to form a respective carbon compound and a reacting of the one of the second set of precursors with the respective carbon compound to form one or more layers of carbon may be performed.

In some examples, a layer of carbon may be exposed to the third precursor to form a second carbon compound on multiple stacks of materials, where the third precursor is an acetylene, a diacetylene, a tri-acetylene, a polyacetylene, an alkene, or an arene and includes at least one of germanium, silicon, or tin. Additionally, the second carbon compound may be exposed to the fourth, carbon-containing precursor to form a second layer of carbon on the second layer of carbon. In some such examples, according to the associated quantity of cycles for each precursor pair of the set of X precursor pairs and to form a respective carbon film asso-ciated with the precursor pair, an exposing with the one of the first set of precursors to form a respective carbon compound and an exposing of the respective carbon compound with the one of the second set of precursors to form one or more layers of carbon may be performed.

In some examples, the second layer of carbon may be formed on the layer of carbon (e.g., second compound 230) by exposing the layer of carbon to the third precursor to form the second carbon compound on the multiple stacks of materials and exposing the second carbon compound to the fourth, carbon-containing precursor to form the second layer of carbon on the layer of carbon, where the third precursor is an acetylene, a diacetylene, a tri-acetylene, a polyacetylene, an alkene, or an arene and comprises at least one of germanium, silicon, or tin. In some examples, a set of carbon films may be formed, where each of the set of carbon films is associated with a precursor pair of a set of X precursor pairs, where each precursor pair of the set of X precursor pairs includes one of a first set of precursors and one of a second set of precursors, where each precursors pair has an associated quantity of cycles, where each precursor of the first set of precursors is independently selected from an acetylene, a diacetylene, a tri-acetylene, a polyacetylene, an alkene, or an arene and includes at least one of germanium, silicon, or tin, where each precursor of the second set of precursors is a carbon-containing precursor, and where each of the set of carbons films is formed by performing, according to the associated quantity of cycles for the associated precursor pair of the set of precursor pairs, an exposing with the one of the first set of precursors to form a respective carbon compound and an exposing of the respective carbon compound with the one of the second set of precursors to form one or more layers of carbon.

The methods described herein may have one or more advantages. For instance, using the first precursor 205 and/or the second precursor 215 as described herein may enable the carbon content of second compound 230 to be as high as 85%, 90%, 95%, 99%, 99.9%, or 100%, may enable a deposited film to contain up to 75%, 85%, 90%, 95%, 99%, 99.9%, or 100% $sp^2$ carbon, and/or may enable that carbon film deposited by ALD is conformal at a bottom of 3D structures (e.g., deep 3D structures, such as 3D structures with a depth above a threshold amount). In some examples, a fraction of $sp^2$ carbon may be controllable to a defined target amount depending on which compound is chosen for the first precursor (e.g., which of an alkene, arene, acetylene, di-acetylene, tri-acetylene, or polyacetylene is chosen). Accordingly, the method described herein may enable modulating an $sp^2$ fraction of a film. Additionally or alternatively, using germanium and/or or tin in the first precursor 205 may enable reactions (e.g., the formation of first compound 220 and/or the formation of second compound 230) to occur at lower temperatures as compared to precursors that do not include germanium and/or tin (e.g., trimethylsilyl precursors). Additionally or alternatively, using germanium and/or tin in the first precursor 205 may enable deposition that occurs more quickly for a given temperature as compared to precursors that do not include germanium and/or tin.

Figure 3:
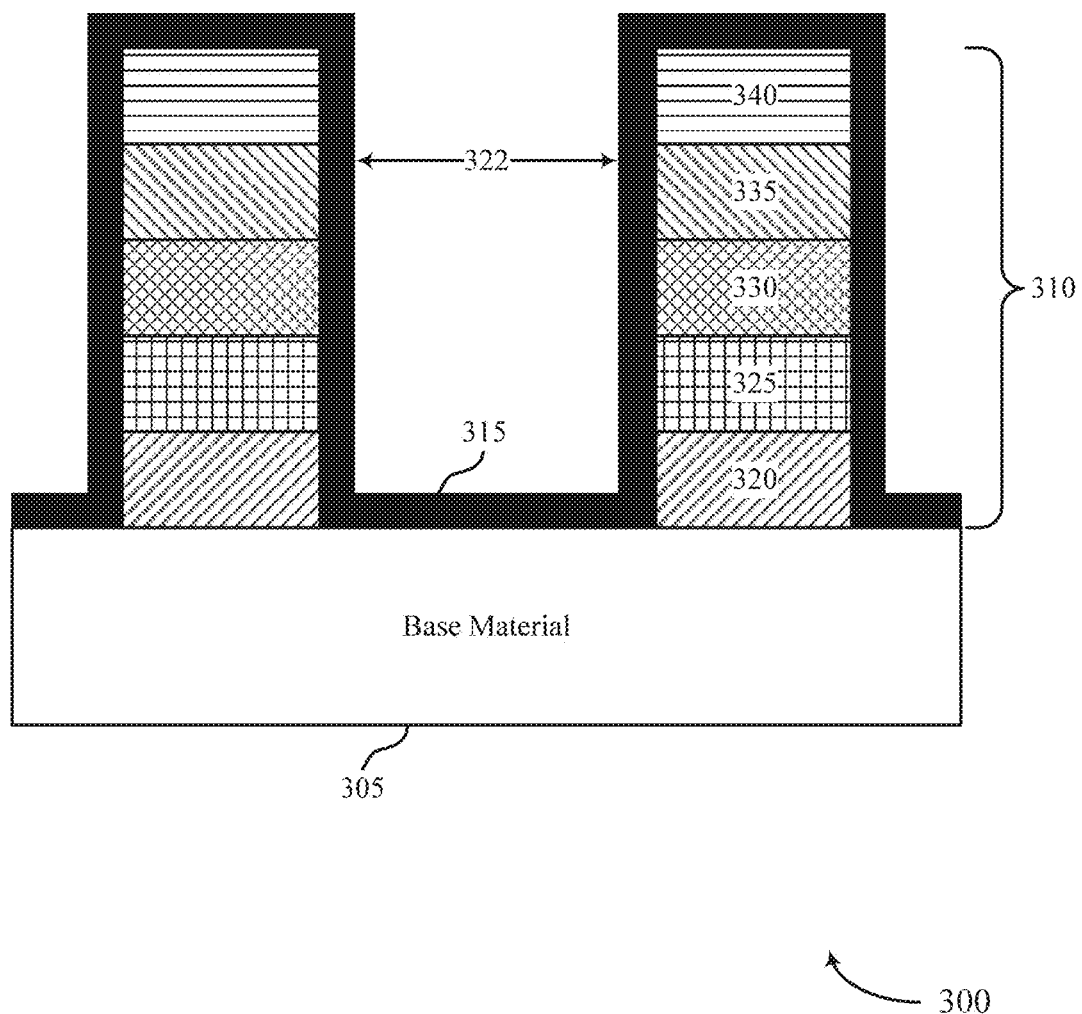
FIG. 3 illustrates an example of an electronic device that supports methods for depositing carbon conducting films by atomic layer deposition in accordance with examples as disclosed herein.

FIG. 3 illustrates an example of an electronic device 300 that supports methods for depositing carbon conducting films by atomic layer deposition in accordance with examples as disclosed herein. The electronic device 300 may include a base material 305 with one or more features 310 (e.g., pillars, stacks), where the base material 305 and the one or more features 310 may be covered in a material 315. Each feature 310 may include materials 320, 325, 330, 335, and 340, where each of material 320, 325, 330, 335, and 340 may be an example of a chalcogenide material, an organic (e.g., carbon) material, a carbon allotrope (e.g., graphite), a reactive metal (e.g., tungsten, aluminum, or tantalum), a thermally-sensitive material, an oxidation-sensitive material, or any combination thereof. Some of material 320, 325, 330, 335, and 340 may be examples of other materials. In some examples, base material 305 or the combination of base material 305 and one or more features 310 may be an example of a base material 105 as described with reference to FIG. 1C or a layer 210 as described with reference to FIG. 2. Additionally or alternatively, material 315 may be an example of a second compound 125 as described with reference to FIG. 1C or a second compound 20 as described with reference to FIG. 2.

While FIG. 3 illustrates feature 310 including five materials, each feature may be made up of a single material or two or more materials (e.g., including more than five materials). The features may be separated from each other by openings 322. The materials of the features 310 may be formed adjacent to (e.g., over) the base material 305 using techniques such as photolithography, physical vapor deposition (PVD), chemical vapor deposition (CVD), or ALD. In some examples, the base material 305 may include one or more materials, layers, structures, or regions thereon. The features 310 may be considered high aspect ratio (HAR) features, where HAR may for instance correspond to greater than or equal to an aspect ratio of 10:1, greater than or equal to an aspect ratio of 20:1, greater than or equal to an aspect ratio of 25:1, or greater than or equal to an aspect ratio of 50:1. In some examples, the material 315 may be formed on one of but not both base material 305 and the one or more features 310. Additionally or alternatively, the material 315 may be formed as a material within each of the one or more features 310. Additionally or alternatively, the material 315 may be formed on a planar material or on a low aspect ratio features of an electronic device.

The material 315 may be formed over the features 310 according to the aspects described herein. For instance, the material 315 may be formed by sequentially exposing the features 310 of the electronic device 300 to a first precursor (e.g., first precursor 205) and a second precursor (e.g., second precursor 215) as described herein. The material 315 may function as a conductive component of electronic device 300, such as a transistor, a capacitor, an electrode, an etch-stop material, a gate, a barrier material, or a spacer material. One or more materials and/or structure, such as a gate, may subsequently be formed in the openings 322 by techniques such as photolithography, PVD, CVD, or ALD and/or additional process acts conducted to form a complete electronic device containing electronic device 300.

The material 315 may be conformally formed on the features 310 according to the aspects described herein. For instance, the thickness of material 315 on sidewalls of the features 310 may be substantially uniform. For instance, the material 315 may be formed to a thickness ranging from a monolayer to 100 nm. Alternatively, the material 315 may be formed at a greater thickness. The material 315 may be in direct contact with each material of the features 310 or some materials of the features 310. Additionally or alternatively, the material 315 may be in contact with the base material 305.

In some examples, the base material 305 may be a structure on a substrate (e.g., a wafer). In some such examples, the base material 305 may span in a first direction and a second direction, where the first direction is orthogonal to the second direction. Additionally, a memory device including the base material 305 may include word lines extending along the first direction and/or the second direction and bit lines extending along a third direction orthogonal to the first direction and the second direction. In some such examples, a stack of materials (e.g., a sequence of materials, such as a stack 310) may be formed in one or more recesses of the word lines, where the stack may extend along the first direction and/or the second direction and where the sequence of materials may include a memory cell (e.g., a chalcogenide element). In some examples, the stacks may each be coupled with one word line and one bit line. In some examples, the techniques described herein may be used to form layers of carbon on the base material 305, the word lines, the bit lines, the stacks, or any combination thereof.

Figure 4:
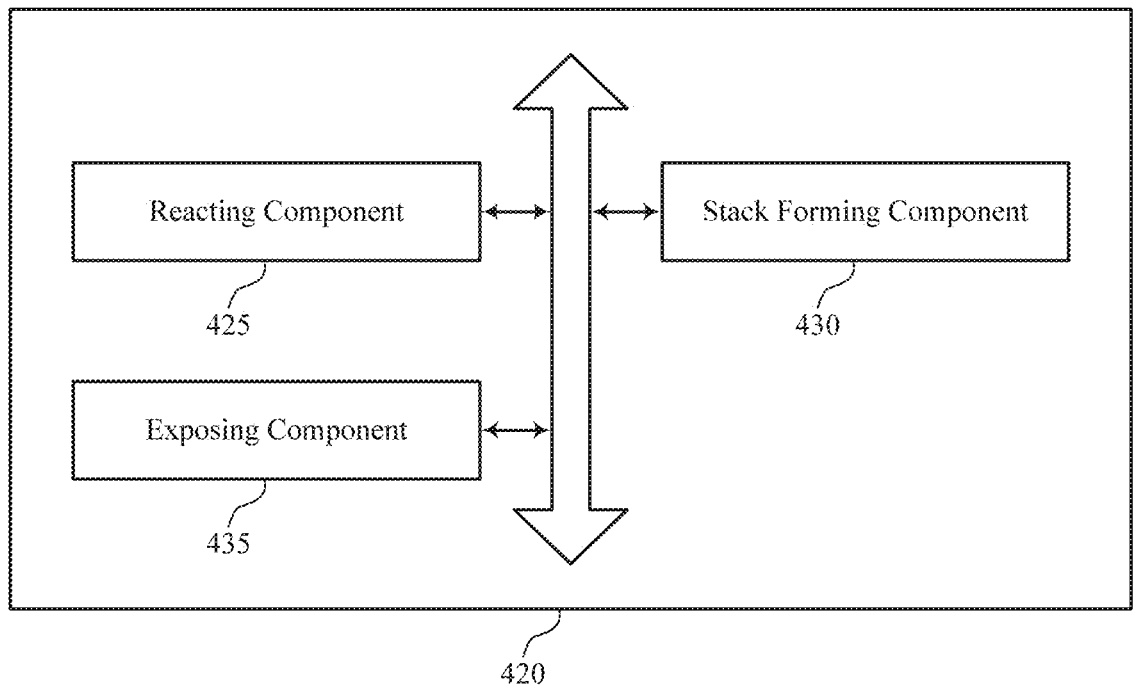
FIG. 4 shows a block diagram of a controller that supports methods for depositing carbon conducting films by atomic layer deposition in accordance with examples as disclosed herein.

FIG. 4 shows a block diagram 400 of a controller 420 that supports methods for depositing carbon conducting films by atomic layer deposition in accordance with examples as disclosed herein. The controller 420 may be an example of aspects of a controller as described with reference to FIGS. 1 through 3. The controller 420, or various components thereof, may be an example of means for performing various aspects of methods for depositing carbon conducting films by atomic layer deposition as described herein. For example, the controller 420 may include a reacting component 425, a stack forming component 430, an exposing component 435, or any combination thereof. Each of these components may communicate, directly or indirectly, with one another (e.g., via one or more buses).

The reacting component 425 may be configured as or otherwise support a means for reacting a first precursor with a base material to form a carbon compound on the base material, where the first precursor is an acetylene, a diacetylene, a tri-acetylene, a poly acetylene, an alkene, or an arene and includes at least one of germanium, silicon, or tin. In some examples, the reacting component 425 may be configured as or otherwise support a means for reacting a second, carbon-containing precursor with the carbon compound to form a layer of carbon on the base material.

In some examples, the first precursor is the acetylene and includes the chemical formula $R_1R_2R_3A$-CC—$ZR_4R_5R_6$. In some examples, A or Z are independently selected from a germanium, a tin, or a silicon. In some examples, CC is two carbons triple bonded with each other. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the diacetylene, the tri-acetylene, the polyacetylene, and includes the chemical formula $R_1R_2R_3A$-CC—CC—$ZR_4R_5R_6$, $R_1R_2R_3A$-CC—CC—CC—$ZR_4R_5R_6$, or $R_1R_2R_3A$-$(CC)_n$—$ZR_4R_5R_6$, where n is greater than or equal to 4. In some examples, A or Z are independently selected from a germanium, a tin, or a silicon. In some examples, each CC is two carbons triple bonded with each other. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the alkene and includes the chemical formula $(R_1R_2R_3A_1)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—(CC—$Z_1R_7R_8R_9)(Z_2R_{10}R_{11}R_{12})$, $(R_1R_2R_3A_1$-CC$)(R_4R_5R_6A_2)$-C=C—(CC—$Z_1R_7R_8R_9$)(CC—$Z_2R_{10}R_{11}R_{12}$), $(R_1R_2R_3A_1$-CC$)(R_4R_5R_6A_2$-CC)—C=C—(CC—$Z_1R_7R_8R_9$)(CC—$Z_2R_{10}R_{11}R_{12}$), or $(R_1R_2R_3A_1$-CC$)(R_4R_5R_6A_2$-CC)—C=C—$(Z_1R_7R_8R_9)(Z_2R_{10}R_{11}R_{12})$. In some examples, $A_1$, $A_2$, $Z_1$, or $Z_2$ are independently selected from a germanium, a tin, or a silicon. In some examples, CC is two carbons triple-bonded with each other. In some examples, C=C is two carbons double bonded with each other. In some examples, each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms—each fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the alkene and includes the chemical formula $R_1R_2R_3A\text{-}CD_1\!=\!CD_2\text{-}ZR_4R_5R_6$, $R_1R_2R_3A\text{-}CC\text{-}CD_1\!=\!CD_2\text{-}ZR_4R_5R_6$, or $R_1R_2R_3A\text{-}CC\text{-}CD_1\!=\!CD_2\text{-}CC\text{-}ZR_4R_5R_6$. In some examples, A or Z are independently selected from a germanium, a tin, or a silicon. In some examples, C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a $-\!SiR_aR_bR_c$ moiety, a $-\!GeR_aR_bR_c$ moiety, a $-\!SnR_aR_bR_c$ moiety, a $-\!SiR_aR_bCR_cR_dR_e$ moiety, a $-\!CR_aR_bSiR_cR_dR_e$ moiety, a $-\!SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, $D_2$ includes the chemical formula $R_7R_8R_9A_2$, where $A_2$ is selected from a germanium, a tin, or a silicon, and where each of $R_7$, $R_8$, and $R_9$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_7$, $R_8$, and $R_9$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, and $R_9$ may be independently selected from a $-\!SiR_aR_bR_c$ moiety, a $-\!GeR_aR_bR_c$ moiety, a $-\!SnR_aR_bR_c$ moiety, a $-\!SiR_aR_bCR_cR_dR_e$ moiety, a $-\!CR_aR_bSiR_cR_dR_e$ moiety, a $-\!SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the arene and includes the chemical formula $R_1R_2R_3A\text{-}C_6Y_1Y_2Y_3Y_4\!-\!ZR_4R_5R_6$, $R_1R_2R_3A\text{-}CC\!-\!C_6Y_1Y_2Y_3Y_4\!-\!ZR_4R_5R_6$, $R_1R_2R_3A\text{-}CC\!-\!C_6Y_1Y_2Y_3Y_4\!-\!CC\!-\!ZR_4R_5R_6$. In some examples, each of A or Z are independently selected from a germanium, a tin, or a silicon. In some examples, CC is two carbons triple-bonded with each other. In some examples, C is a carbon and $Y_1$, $Y_2$, $Y_3$, and $Y_4$ are each independently selected from hydrogen (or deuterium), methyl, ethyl, propyl, isopropyl, an alkyl, an aryl, a linear alkoxy, a branched alkoxy, or a hexyl alkoxy. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, $Y_1$ includes the chemical formula $R_7R_8R_9A_2$, or the chemical formula $R_7R_8R_9A_2$-CC; $Y_2$ includes the chemical formula $R_{10}R_{11}R_{12}A_3$, or the chemical formula $R_{10}R_{11}R_{12}A_3$-CC; $Y_3$ includes the chemical formula $R_{13}R_{14}R_{15}A_4$, or the chemical formula $R_{13}R_{14}R_{15}A_4$-CC; $Y_4$ includes the chemical formula $R_{16}R_{17}R_{18}A_5$, or the chemical formula $R_{16}R_{17}R_{18}A_5$-CC; or any combination thereof, where $A_2$, $A_3$, $A_4$, $A_5$ are independently selected from a germanium, a tin, or a silicon, and where $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride, and CC is two carbons triple-bonded with each other. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the second, carbon-containing precursor includes the chemical formula $CX_1X_2X_3X_4$, or $W_1$=$CX_3X_4$, or $W_1$=C=$W_2$, or $NCX_3$, where each of $X_1$, $X_2$, $X_3$, and $X_4$ are independently selected from a fluoride, a chloride, a bromide, an iodide, a methoxy, an ethoxy, an alkoxy, an alkyl-sulfide, an alkyl-selenide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate, a dimethylamide, a diethylamide, an ethylmethylamide, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), hydrogen (or deuterium) or an alkyl, or an aryl, or an alkyl containing double or triple carbon-carbon bonds, or any combination thereof. Additionally. $W_1$ and $W_2$ are independently selected from oxygen, sulfur, selenium, or tellurium; examples of molecules containing $W_1$ and $W_2$ can be O=$CCl_2$, O=C=S, or S=C=S. Additionally, N is nitrogen, examples of molecules containing N can be NCBr, cyanogen bromide.

In some examples, the second, carbon-containing precursor includes a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. In some additional examples, the second, carbon-containing may include an carboxylic acid halide, an halogenated carboxylic acid halide, a perhalogenated carboxylic acid halide, a di(carboxylic acid)di-halide, chloral. Examples of, respectively, each of these families can be formic acid chloride, HCOCl; chloroacetic acid chloride, $ClCH_2$—COCl; trifluoracetic acid chloride, $CF_3$—COCl; oxalic acid dichloride, ClOC—COCl; chloral, $CCl_3$—CHO. In more additional examples, the second, carbon-containing may include a carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, $ClCH_2$—COOH; trifluoracetic acid, $CF_3$—COOH; oxalic acid, HOOC—COOH; oxalic acid chloride, HOOC—COCl.

In some examples, reacting the first precursor with the base material or reacting the second, carbon-containing precursor with the carbon compound to form the layer of carbon includes conducting the reacting at a temperature at or below 500° C.

In some examples, the temperature is at or below 400° C.

The stack forming component 430 may be configured as or otherwise support a means for forming a plurality of stacks of materials on a substrate. The exposing component 435 may be configured as or otherwise support a means for exposing the plurality of stacks of materials to a first precursor to form a carbon compound on the plurality of stacks of materials, where the first precursor is an acetylene, a diacetylene, a tri-acetylene, a polyacetylene, an alkene, or an arene and includes at least one of germanium, silicon, or tin. In some examples, the exposing component 435 may be configured as or otherwise support a means for exposing the plurality of stacks to a second, carbon-containing precursor to form layer of carbon on the plurality of stacks of materials.

In some examples, the first precursor is the acetylene and includes the chemical formula $R_1R_2R_3A$-CC—$ZR_4R_5R_6$. In some examples, A or Z are independently selected from a germanium, a tin, or a silicon. In some examples, CC is two carbons triple bonded with each other. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the diacetylene, the tri-acetylene, the polyacetylene, and includes the chemical formula $R_1R_2R_3A$-CC—CC—$ZR_4R_5R_6$, $R_1R_2R_3A$-CC—CC—CC—$ZR_4R_5R_6$, or $R_1R_2R_3A$-$(CC)_n$—$ZR_4R_5R_6$, where n is greater than or equal to 4. In some examples. A or Z are independently selected from a germanium, a tin, or a silicon. In some examples, each CC is two carbons triple bonded with each other. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the alkene and includes the chemical formula $(R_1R_2R_3A_1)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—$(Z_1R_7R_8R_9)(Z_2R_{10}R_{11}R_{12})$, $(R_1R_2R_3A_1)(R_4R_5R_6A_2)$-C=C—$(CC$—$Z_1R_7R_8R_9)(Z_2R_{10}R_{11}R_{12})$, $(R_1R_2R_3A_1$-CC$)(R_4R_5R_6A_2)$-C=C—$(CC$—$Z_1R_7R_8R_9)(CC$—$Z_2R_{10}R_{11}R_{12})$, $(R_1R_2R_3A_1$-CC$)$ ($R_4R_5R_6A_2$-CC)—C=C—(CC—$Z_1R_7R_8R_9$)(CC—$Z_2R_{10}R_{11}R_{12}$), or ($R_1R_2R_3A_1$-CC)($R_4R_5R_6A_2$-CC)—C=C—($Z_1R_7R_8R_9$)($Z_2R_{10}R_{11}R_{12}$). In some examples, $A_1$, $A_2$, $Z_1$, or $Z_2$ are independently selected from a germanium, a tin, or a silicon. In some examples, C=C is two carbons double bonded with each other and CC is two carbons triple-bonded with each other. In some examples, each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, $R_6$, $R_7$, $R_8$, $R_9$, $R_{10}$, $R_{11}$, and $R_{12}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_b$-$SiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the first precursor is the alkene and includes the chemical formula $R_1R_2R_3$A-$CD_1$=$CD_2$-$ZR_4R_5R_6$, $R_1R_2R_3$A-CC-$CD_1$=$CD_2$-$ZR_4R_5R_6$, or $R_1R_2R_3$A-CC-$CD_1$=$CD_2$-CC—$ZR_4R_5R_6$. In some examples, A or Z are independently selected from a germanium, a tin, or a silicon. In some examples, CC is two carbons triple bonded with each other. In some examples, C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, $D_2$ includes the chemical formula $R_7R_8R_9A_2$, where $A_2$ is selected from a germanium, a tin, or a silicon, and where each of $R_7$, $R_8$, and $R_9$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. In some examples, $D_1$ includes the chemical formula $R_{10}R_{11}R_{12}A_3$, where $A_3$ is selected from a germanium, a tin, or a silicon, and where each of $R_{10}$, $R_{11}$, and $R_{12}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_7$, $R_8$, and $R_9$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, and $R_9$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic, $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate In some examples, the first precursor is the arene and includes the chemical formula the chemical formula $R_1R_2R_3A$-$C_6Y_1Y_2Y_3Y_4$—$ZR_4R_5R_6$, $R_1R_2R_3A$-CC—$C_6Y_1Y_2Y_3Y_4$—$ZR_4R_5R_6$, $R_1R_2R_3A$-CC—$C_6Y_1Y_2Y_3Y_4$—CC—$ZR_4R_5R_6$. In some examples, each of A or Z are independently selected from a germanium, a tin, or a silicon. In some examples, C is a carbon and $Y_1$, $Y_2$, $Y_3$, and $Y_4$ are each independently selected from hydrogen (or deuterium), methyl, ethyl, propyl, isopropyl, an alkyl, an aryl, a linear alkoxy, a branched alkoxy, or a hexyl alkoxy. In some examples, each of $R_1$, $R_2$, $R_3$, $R_4$, $R_5$, and $R_6$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride, and CC is two carbons triple bonded with each other. Additionally or alternatively, each of $R_1$, $R_2$, $R_3$, $R_4$, $R_5$, and $R_6$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_1$, $R_2$, $R_3$, $R_4$, $R_5$, and $R_6$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, $Y_1$ includes the chemical formula $R_7R_8R_9A_2$, or the chemical formula $R_7R_8R_9A_2$-CC; $Y_2$ includes the chemical formula $R_{10}R_{11}R_{12}A_3$, or the chemical formula $R_{10}R_{11}R_{12}A_3$-CC; $Y_3$ includes the chemical formula $R_{13}R_{14}R_{15}A_4$, or the chemical formula $R_{13}R_{14}R_{15}A_4$-CC; $Y_4$ includes the chemical formula $R_{16}R_{17}R_{16}A_5$, or the chemical formula $R_{16}R_{17}R_{18}A_5$-CC; or any combination thereof, where $A_2$, $A_3$, $A_4$, $A_5$ are independently selected from a germanium, a tin, or a silicon, and where $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, or an alkyl-telluride. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate. Additionally or alternatively, each of $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ may be independently selected from a —$SiR_aR_bR_c$ moiety, a —$GeR_aR_bR_c$ moiety, a —$SnR_aR_bR_c$ moiety, a —$SiR_aR_bCR_cR_dR_e$ moiety, a —$CR_aR_bSiR_cR_dR_e$ moiety, a —$SiR_aR_bGeR_cR_dR_e$ moiety, or more generally a moiety containing a set of carbon, silicon, germanium, or tin atoms (e.g., this set of atoms may contain up to 10 Carbon, Silicon, Germanium, and Tin atoms, excluding those C, Si, Ge, or Sn atoms that could be part of the $R_x$ substituents)—each C, Si, Ge, or Sn atom may be fully saturated with $R_x$ substituents; this set can be linear, branched or cyclic; $R_a$, $R_b$, $R_c$, $R_d$, $R_e$, and all $R_x$ are independently selected from hydrogen (or deuterium), an alkyl group, an aryl group, an alkoxy, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), an alkyl-sulfide, an alkyl-selenide, a halide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate.

In some examples, the second, carbon-containing precursor includes the chemical formula $CX_1X_2X_3X_4$, or $W_1=CX_3X_4$, or $W_1=C=W_2$, or $NCX_3$, where each of $X_1$, $X_2$, $X_3$, and $X_4$ are independently selected from a fluoride, a chloride, a bromide, an iodide, a methoxy, an ethoxy, an alkoxy, an alkyl-sulfide, an alkyl-selenide, an alkyl-telluride, a cyanide, an isocyanide, a cyanate, an isocyanate, a thiocyanate, an isothiocyanate, a selenocyanate, an isoselenocyanate, a tellurocyanate, an isotellurocyanate, an azide, a fulminate, or an isofulminate, a dimethylamide, a diethylamide, an ethylmethylamide, a di-alkylamide, an amide with an alkyl and a silyl substituent (e.g., the silyl group has hydrogen, deuterium or alkyl substituents), an amide with two silyl substituents (e.g., the silyl groups have hydrogen, deuterium or alkyl substituents), an amide with an alkyl and a germyl substituent (e.g., the germyl group has hydrogen, deuterium or alkyl substituents), a tri-alkylhydrazide, a hydrazide with a combination of three substituents which can be alkyl, silyl, or germyl (e.g., the silyl group and the germyl group have hydrogen, deuterium or alkyl substituents), hydrogen (or deuterium) or an alkyl, or an aryl, or an alkyl containing double or triple carbon-carbon bonds, or any combination thereof. Additionally, $W_1$ and $W_2$ are independently selected from oxygen, sulfur, selenium, or tellurium; examples of molecules containing $W_1$ and $W_2$ can be $O=CCl_2$, $O=C=S$, or $S=C=S$. Additionally, N is nitrogen; examples of molecules containing N can be NCBr, cyanogen bromide.

In some examples, the second, carbon-containing precursor includes a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. In some additional examples, the second, carbon-containing may include an carboxylic acid halide, an halogenated carboxylic acid halide, a perhalogenated carboxylic acid halide, a di(carboxylic acid) di-halide, chloral. Examples of, respectively, each of these families can be formic acid chloride, HCOCl; chloroacetic acid chloride, $ClCH_2$—COCl; trifluoracetic acid chloride, $CF_3$—COCl; oxalic acid dichloride, ClOC—COCl; chloral, $CCl_3$—CHO. In more additional examples, the second, carbon-containing may include a carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, $ClCH_2$—COOH; trifluoracetic acid, $CF_3$—COOH; oxalic acid, HOOC—COOH; oxalic acid chloride, HOOC—COCl.

In some examples, reacting the first precursor with the base material or reacting the second, carbon-containing precursor with the carbon compound to form the layer of carbon includes conducting the reacting at a temperature at or below 500° C.

In some examples, the temperature is at or below 400° C.

Figure 5:
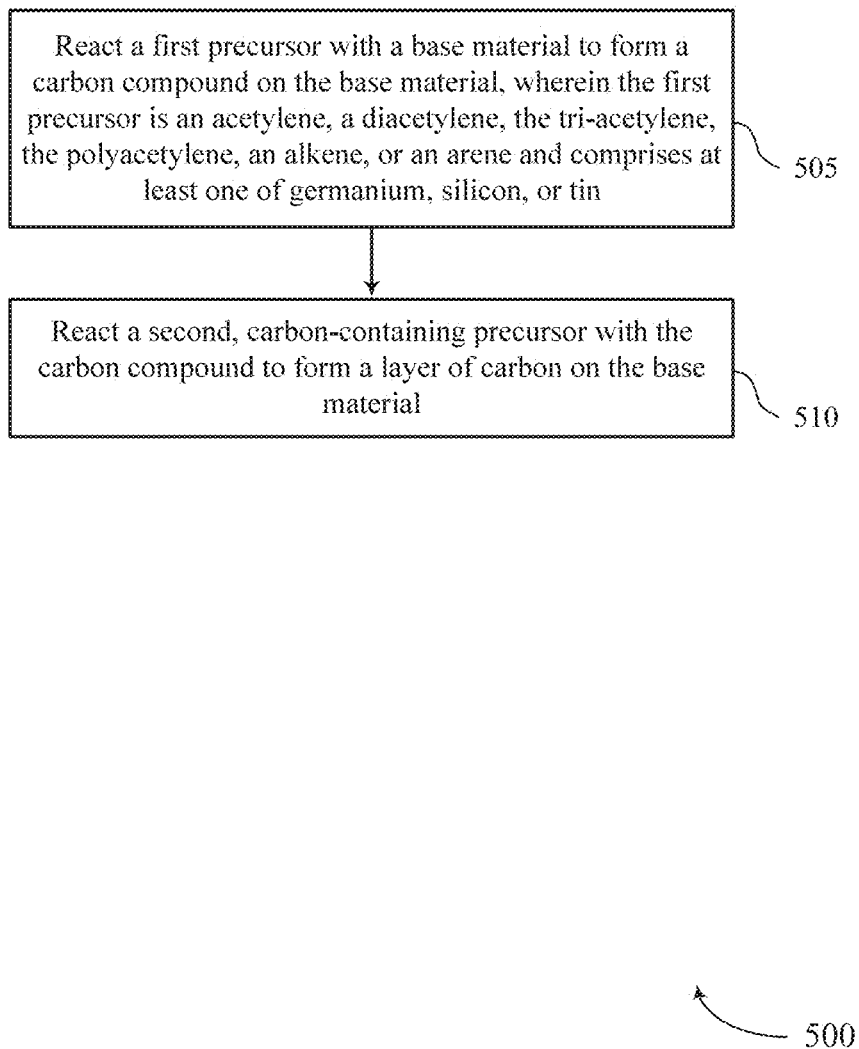
FIGS. 5 and 6 show flowcharts illustrating a method or methods that support methods for depositing carbon conducting films by atomic layer deposition in accordance with examples as disclosed herein.

FIG. 5 shows a flowchart illustrating a method 500 that supports methods for depositing carbon conducting films by atomic layer deposition in accordance with examples as disclosed herein. The operations of method 500 may be implemented by a controller or its components as described herein. For example, the operations of method 500 may be performed by a controller as described with reference to FIGS. 1 through 4. In some examples, a controller may execute a set of instructions to control the functional elements of the device to perform the described functions. Additionally, or alternatively, the controller may perform aspects of the described functions using special-purpose hardware.

At 505, the method may include reacting a first precursor with a base material to form a carbon compound on the base material, where the first precursor is an acetylene, a diacetylene, a tri-acetylene, a polyacetylene, an alkene, or an arene and includes at least one of germanium, silicon, or tin. The operations of 505 may be performed in accordance with examples as disclosed herein. In some examples, aspects of the operations of 505 may be performed by a reacting component 425 as described with reference to FIG. 4.

At 510, the method may include reacting a second, carbon-containing precursor with the carbon compound to form a layer of carbon on the base material. The operations of 510 may be performed in accordance with examples as disclosed herein. In some examples, aspects of the operations of 510 may be performed by a reacting component 425 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for reacting a first precursor with a base material to form a carbon compound on the base material, where the first precursor is an acetylene, a diacetylene, a tri-acetylene, a polyacetylene, an alkene, or an arene and includes at least one of germanium, silicon, or tin and reacting a second, carbon-containing precursor with the carbon compound to form a layer of carbon on the base material.

Aspect 2: The method, apparatus, or non-transitory computer-readable medium of aspect 1, wherein the operations, features, circuitry, logic, means, or instructions, or any combination thereof are further for reacting a third precursor with the layer of carbon to form a second carbon compound on the first layer of carbon, wherein the third precursor is an acetylene, a diacetylene, a tri-acetylene, a polyacetylene, an alkene, or an arene and comprises at least one of germanium, silicon, or tin; and reacting a fourth, carbon-containing precursor with the second carbon compound to form a second layer of carbon on the first layer of carbon.

Aspect 3: The method, apparatus, or non-transitory computer-readable medium of aspect 2, wherein the operations, features, circuitry, logic, means, or instructions, or any combination thereof are further for identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors is independently selected from an acetylene, a diacetylene, a tri-acetylene, a polyacetylene, an alkene, or an arene and comprises at least one of germanium, silicon, or tin, and wherein each precursor of the second set of precursors is a carbon-containing precursor; and performing, according to the associated quantity of cycles for each precursor pair of the set of X precursor pairs and to form a respective carbon film associated with the precursor pair, a reacting of the one of the first set of precursors to form a respective carbon compound and a reacting of the one of the second set of precursors with the respective carbon compound to form one or more layers of carbon.

Aspect 4: The method, apparatus, or non-transitory computer-readable medium of aspects 1 through 3, where the first precursor is the acetylene and includes the chemical formula $R_1R_2R_3A$-CC—$ZR_4R_5R_6$; A or Z are independently selected from a germanium, a tin, or a silicon; CC is two carbons triple bonded with each other; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 5: The method, apparatus, or non-transitory computer-readable medium of any of aspects 1 through 4, where the first precursor is the diacetylene, the tri-acetylene, the polyacetylene, and includes the chemical formula $R_1R_2R_3A$-CC—CC—$ZR_4R_5R_6$, $R_1R_2R_3A$-CC—CC—CC—$ZR_4R_5R_6$, or $R_1R_2R_3A$-$(CC)_n$—$ZR_4R_5R_6$, where n is greater than or equal to 4; A or Z are independently selected from a germanium, a tin, or a silicon; each CC is two carbons triple bonded with each other; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 6: The method, apparatus, or non-transitory computer-readable medium of any of aspects 1 through 5, where the first precursor is the alkene and includes the chemical formula $(R_1R_2R_3A_1)(R_4R_5R_6A_2)\text{-}C{=}C\text{-}(Z_1R_7R_8R_9)(Z_2R_{10}R_{11}R_{12})$, $(R_1R_2R_3A_1\text{-}CC)(R_4R_5R_6A_2)\text{-}C{=}C\text{-}(Z_1R_7R_8R_9)(Z_2R_{10}R_{11}R_{12})$, $(R_1R_2R_3A_1\text{-}CC)(R_4R_5R_6A_2)\text{-}C{=}C\text{-}(CC\text{-}Z_1R_7R_8R_9)(Z_2R_{10}R_{11}R_{12})$, $(R_1R_2R_3A_1\text{-}CC)(R_4R_5R_6A_2)\text{-}C{=}C\text{-}(CC\text{-}Z_1R_7R_8R_9)(CC\text{-}Z_2R_{10}R_{11}R_{12})$, $(R_1R_2R_3A_1\text{-}CC)(R_4R_5R_6A_2\text{-}CC)\text{-}C{=}C\text{-}(CC\text{-}Z_1R_7R_8R_9)(CC\text{-}Z_2R_{10}R_{11}R_{12})$, or $(R_1R_2R_3A_1\text{-}CC)(R_4R_5R_6A_2\text{-}CC)\text{-}C{=}C\text{-}(Z_1R_7R_8R_9)(Z_2R_{10}R_{11}R_{12})$; $A_1$, $A_2$, $Z_1$, or $Z_2$ are independently selected from a germanium, a tin, or a silicon; $C{=}C$ is two carbons double bonded with each other and CC is two carbons triple-bonded with each other; and each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 7: The method, apparatus, or non-transitory computer-readable medium of any of aspects 1 through 6, where the first precursor is the alkene and includes the chemical formula $R_1R_2R_3A\text{-}CD_1{=}CD_2\text{-}ZR_4R_5R_6$, $R_1R_2R_3A\text{-}CC\text{-}CD_1{=}CD_2\text{-}ZR_4R_5R_6$, or $R_1R_2R_3A\text{-}CC\text{-}CD_1{=}CD_2\text{-}CC\text{-}ZR_4R_5R_6$; A or Z are independently selected from a germanium, a tin, or a silicon; CC is two carbons triple bonded with each other; C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate, an isotellurocyanate; an azide; a fulminate; or an isofulminate.

Aspect 8: The method, apparatus, or non-transitory computer-readable medium of aspect 7, where $D_2$ includes the chemical formula $R_7R_8R_9A_2$, where $A_2$ is selected from a germanium, a tin, or a silicon, and where each of $R_7$, $R_8$, and $R_9$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiR$_a$R$_b$R$_c$ moiety; a —GeR$_a$R$_b$R$_c$ moiety; a —SnR$_a$R$_b$R$_c$ moiety; a —SiR$_a$R$_b$CR$_c$R$_d$R$_e$ moiety; a —CR$_a$R$_b$SiR$_c$R$_d$R$_e$ moiety; a —SiR$_a$R$_b$GeR$_c$R$_d$R$_e$ moiety; or a moiety containing a set of carbon atoms, silicon atoms, germanium atoms, tin atoms, or any combination thereof each fully saturated with respective substituents R$_a$, R$_b$, R$_c$, R$_d$, R$_e$, . . . , R$_x$ and comprising 1 to 10 carbon atoms, silicon atoms, germanium atoms, tin atoms, or any combination thereof distinct from any carbon, silicon, germanium, or tin within the respective substituents R$_a$, R$_b$, R$_c$, R$_d$, R$_e$, . . . , R$_x$, wherein x of R$_x$ is an index different than a of R$_a$, wherein the set of carbon atoms, silicon atoms, germanium atoms, tin atoms, or any combination thereof is linear, branched, or cyclic; and wherein R$_a$, R$_b$, R$_c$, R$_d$, R$_e$, . . . , R$_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 9: The method, apparatus, or non-transitory computer-readable medium of any of aspects 1 through 10, where the first precursor is the arene and includes the chemical formula the chemical formula R$_1$R$_2$R$_3$A-C$_6$Y$_1$Y$_2$Y$_3$Y$_4$—ZR$_4$R$_5$R$_6$, R$_1$R$_2$R$_3$A-CC—C$_6$Y$_1$Y$_2$Y$_3$Y$_4$—ZR$_4$R$_5$R$_6$, R$_1$R$_2$R$_3$A-CC—C$_6$Y$_1$Y$_2$Y$_3$Y$_4$—CC—ZR$_4$R$_5$R$_6$; each of A or Z are independently selected from a germanium, a tin, or a silicon; CC is two carbons triple-bonded with each other; C is a carbon, and Y$_1$, Y$_2$, Y$_3$, and Y$_4$ are each independently selected from hydrogen (or deuterium), methyl, ethyl, propyl, isopropyl, an alkyl, an aryl, a linear alkoxy, a branched alkoxy, or a hexyl alkoxy; and each of R$_1$, R$_2$, R$_3$, R$_4$, R$_5$, and R$_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiR$_a$R$_b$R$_c$ moiety; a —GeR$_a$R$_b$R$_c$ moiety; a —SnR$_a$R$_b$R$_c$ moiety; a —SiR$_a$R$_b$CR$_c$R$_d$R$_e$ moiety; a —CR$_a$R$_b$SiR$_c$R$_d$R$_e$ moiety; a —SiR$_a$R$_b$GeR$_c$R$_d$R$_e$ moiety; or a moiety containing a set of carbon atoms, silicon atoms, germanium atoms, tin atoms, or any combination thereof each fully saturated with respective substituents R$_a$, R$_b$, R$_c$, R$_d$, R$_e$, . . . , R$_x$ and comprising 1 to 10 carbon atoms, silicon atoms, germanium atoms, tin atoms, or any combination thereof distinct from any carbon, silicon, germanium, or tin within the respective substituents R$_a$, R$_b$, R$_c$, R$_d$, R$_e$, . . . , R$_x$, wherein x of R$_x$ is an index different than a of R$_a$, wherein the set of carbon atoms, silicon atoms, germanium atoms, tin atoms, or any combination thereof is linear, branched, or cyclic; and wherein R$_a$, R$_b$, R$_c$, R$_d$, R$_e$, . . . , R$_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 10: The method, apparatus, or non-transitory computer-readable medium of aspect 9, where Y$_1$ includes the chemical formula R$_7$R$_8$R$_9$A$_2$, or the chemical formula R$_7$R$_8$R$_9$A$_2$-CC; Y$_2$ includes the chemical formula R$_{10}$R$_{11}$R$_{12}$A$_3$, or the chemical formula R$_{10}$R$_{11}$R$_{12}$A$_3$-CC; Y$_3$ includes the chemical formula R$_{13}$R$_{14}$R$_{15}$A$_4$, or the chemical formula R$_{13}$R$_{14}$R$_{15}$A$_4$-CC; Y$_4$ includes the chemical formula R$_{16}$R$_{17}$R$_{18}$A$_5$, or the chemical formula R$_{16}$R$_{17}$R$_{18}$A$_5$-CC; or any combination thereof, where A$_2$, A$_3$, A$_4$, A$_5$ are independently selected from a germanium, a tin, or a silicon, and where R$_7$, R$_8$, R$_9$, R$_{10}$, R$_{11}$, R$_{12}$, R$_{13}$, R$_{14}$, R$_{15}$, R$_{16}$, R$_{17}$, and R$_{18}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —SiR$_a$R$_b$R$_c$ moiety; a —GeR$_a$R$_b$R$_c$ moiety; a —SnR$_a$R$_b$R$_c$ moiety; a —SiR$_a$R$_b$CR$_c$R$_d$R$_e$ moiety; a —CR$_a$R$_b$SiR$_c$R$_d$R$_e$ moiety; a —SiR$_a$R$_b$GeR$_c$R$_d$R$_e$ moiety; or a moiety containing a set of carbon atoms, silicon atoms, germanium atoms, tin atoms, or any combination thereof each fully saturated with respective substituents R$_a$, R$_b$, R$_c$, R$_d$, R$_e$, . . . , R$_x$ and comprising 1 to 10 carbon atoms, silicon atoms, germanium atoms, tin atoms, or any combination thereof distinct from any carbon, silicon, germanium, or tin within the respective substituents R$_a$, R$_b$, R$_c$, R$_d$, R$_e$, . . . , R$_x$, wherein x of R$_x$ is an index different than a of R$_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 11: The method, apparatus, or non-transitory computer-readable medium of any of aspects 1 through 10, where the second, carbon-containing precursor includes the chemical formula $CX_1X_2X_3X_4$, or $W_1=CX_3X_4$, or $W_1=C=W_2$, or $NCX_3$, where each of $X_1$, $X_2$, $X_3$, and $X_4$ are independently selected from a fluoride; a chloride; a bromide; an iodide; a methoxy; an ethoxy; an alkoxy; an alkyl-sulfide; an alkyl-selenide; an alkyl-telluride; a cyanide; an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a dimethylamide; a diethylamide; an ethylmethylamide; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; hydrogen, deuterium; an alkyl; an aryl; an alkyl containing double or triple carbon-carbon bonds; or any combination thereof. Additionally, $W_1$ and $W_2$ are independently selected from oxygen, sulfur, selenium, or tellurium; examples of molecules containing $W_1$ and $W_2$ can be $O=CCl_2$, $O=C=S$, or $S=C=S$. Additionally, N is nitrogen; examples of molecules containing N can be NCBr, cyanogen bromide.

Aspect 12: The method, apparatus, or non-transitory computer-readable medium of any of aspects 1 through 11, where the second, carbon-containing precursor includes a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. The method, apparatus, or non-transitory computer-readable medium of any of aspects 1 through 10, where the second, carbon-containing may include an carboxylic acid halide, an halogenated carboxylic acid halide, a perhalogenated carboxylic acid halide, a di(carboxylic acid) di-halide, chloral. Examples of, respectively, each of these families can be formic acid chloride, HCOCl; chloroacetic acid chloride, $ClCH_2$—COCl; trifluoroacetic acid chloride, $CF_3$—COCl; oxalic acid dichloride, ClOC—COCl; chloral, $CCl_3$—CHO. The method, apparatus, or non-transitory computer-readable medium of any of aspects 1 through 10, where the second, carbon-containing may include a carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, $ClCH_2$—COOH; trifluoroacetic acid, $CF_3$—COOH; oxalic acid, HOOC—COOH; oxalic acid chloride, HOOC—COCl.

Aspect 13: The method, apparatus, or non-transitory computer-readable medium of any of aspects 1 through 12, where reacting the first precursor with the base material or reacting the second, carbon-containing precursor with the carbon compound to form the layer of carbon includes conducting the reacting at a temperature at or below 500° C.

Aspect 14: The method, apparatus, or non-transitory computer-readable medium of aspect 13, where the temperature is at or below 400° C.

Figure 6:
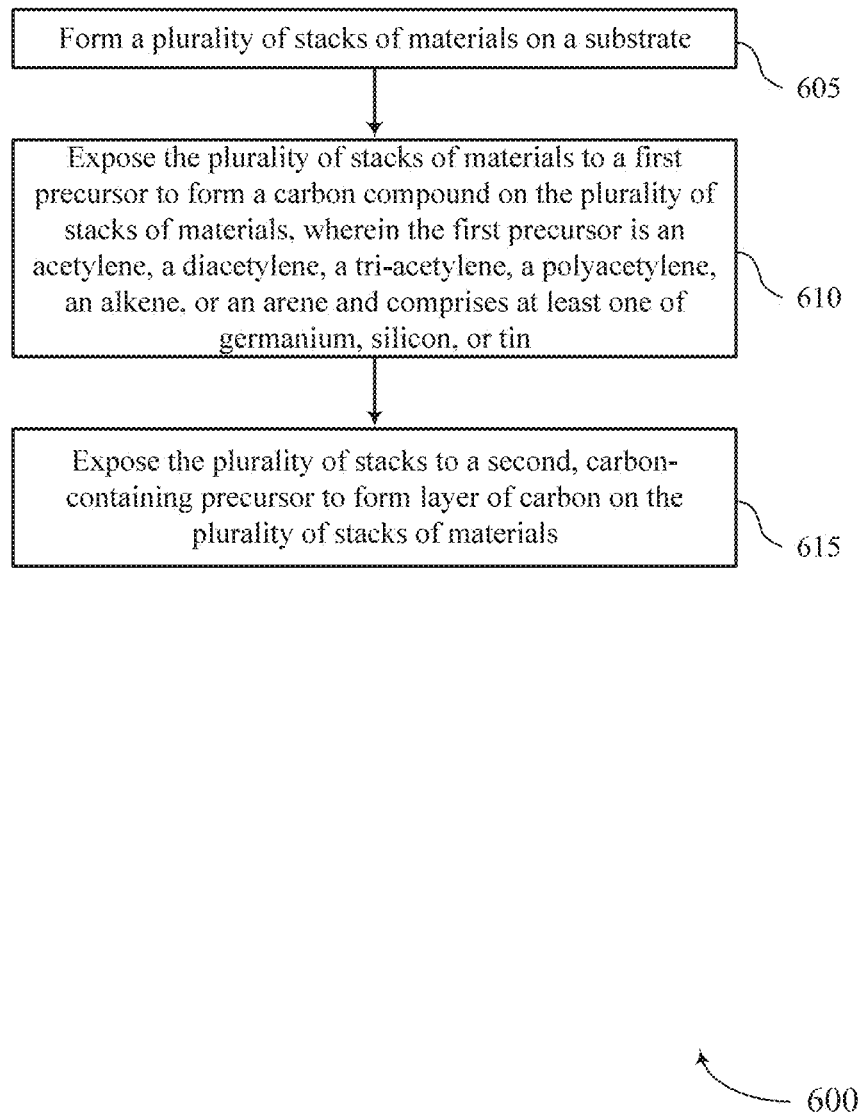

FIG. 6 shows a flowchart illustrating a method 600 that supports methods for depositing carbon conducting films by atomic layer deposition in accordance with examples as disclosed herein. The operations of method 600 may be implemented by a controller or its components as described herein. For example, the operations of method 600 may be performed by a controller as described with reference to FIGS. 1 through 4. In some examples, a controller may execute a set of instructions to control the functional elements of the device to perform the described functions. Additionally, or alternatively, the controller may perform aspects of the described functions using special-purpose hardware.

At 605, the method may include forming a plurality of stacks of materials on a substrate. The operations of 605 may be performed in accordance with examples as disclosed herein. In some examples, aspects of the operations of 605 may be performed by a stack forming component 430 as described with reference to FIG. 4.

At 610, the method may include exposing the plurality of stacks of materials to a first precursor to form a carbon compound on the plurality of stacks of materials, where the first precursor is an acetylene, a diacetylene, a tri-acetylene, a polyacetylene, an alkene, or an arene and includes at least one of germanium, silicon, or tin. The operations of 610 may be performed in accordance with examples as disclosed herein. In some examples, aspects of the operations of 610 may be performed by an exposing component 435 as described with reference to FIG. 4.

At 615, the method may include exposing the plurality of stacks to a second, carbon-containing precursor to form layer of carbon on the plurality of stacks of materials. The operations of 615 may be performed in accordance with examples as disclosed herein. In some examples, aspects of the operations of 615 may be performed by an exposing component 435 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 15: A method, apparatus, or non-transitory computer-readable medium including operations, features, circuitry, logic, means, or instructions, or any combination thereof for forming a plurality of stacks of materials on a substrate; exposing the plurality of stacks of materials to a first precursor to form a carbon compound on the plurality of stacks of materials, where the first precursor is an acetylene, a diacetylene, a tri-acetylene, a polyacetylene, an alkene, or an arene and includes at least one of germanium, silicon, or tin; and exposing the plurality of stacks to a second, carbon-containing precursor to form layer of carbon on the plurality of stacks of materials.

Aspect 16: The method, apparatus, or non-transitory computer-readable medium of aspect 15, wherein the operations, features, circuitry, logic, means, or instructions, or any combination thereof are further for exposing the layer of carbon to a third precursor to form a second carbon compound on the plurality of stacks of materials, wherein the third precursor is an acetylene, a diacetylene, a tri-acetylene, a polyacetylene, an alkene, or an arene and comprises at least one of germanium, silicon, or tin; and exposing the second carbon compound to a fourth, carbon-containing precursor to form a second layer of carbon on the second layer of carbon.

Aspect 17: The method, apparatus, or non-transitory computer-readable medium of aspect 16, wherein the operations, features, circuitry, logic, means, or instructions, or any combination thereof are further for identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors is independently selected from an acetylene, a diacetylene, a tri-acetylene, a polyacetylene, an alkene, or an arene and comprises at least one of germanium, silicon, or tin, and wherein each precursor of the second set of precursors is a carbon-containing precursor; and performing, according to the associated quantity of cycles for each precursor pair of the set of X precursor pairs and to form a respective carbon film associated with the precursor pair, an exposing with the one of the first set of precursors to form a respective carbon compound and an exposing of the respective carbon compound with the one of the second set of precursors to form one or more layers of carbon.

Aspect 18: The method, apparatus, or non-transitory computer-readable medium of any of aspects 15 through 17, where the first precursor is the acetylene and includes the chemical formula $R_1R_2R_3A$-CC—$ZR_4R_5R_6$; A or Z are independently selected from a germanium, a tin, or a silicon; CC is two carbons triple bonded with each other; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety, a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 19: The method, apparatus, or non-transitory computer-readable medium of any of aspects 15 through 18, where the first precursor is the diacetylene, the tri-acetylene, the polyacetylene, and includes the chemical formula $R_1R_2R_3A$-CC—CC—$ZR_4R_5R_6$, $R_1R_2R_3A$-CC—CC—CC—$ZR_4R_5R_6$, or $R_1R_2R_3A$-$(CC)_n$—$ZR_4R_5R_6$, where n is greater than or equal to 4; A or Z are independently selected from a germanium, a tin, or a silicon; each CC is two carbons triple bonded with each other; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 20: The method, apparatus, or non-transitory computer-readable medium of any of aspects 15 through 19, where the first precursor is the alkene and includes the chemical formula $(R_1R_2R_3A_1)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—(CC—$Z_1R_7R_8R_9)(Z_2R_{10}R_{11}R_{12})$, $R_1R_2R_3A_1$-CC$)(R_4R_5R_6A_2)$-C=C—(CC—$Z_1R_7R_8R_9)$(CC—$Z_2R_{10}R_{11}R_{12})$, or $(R_1R_2R_3A_1$-CC$)(R_4R_5R_6A_2$-CC)—C=C—$(Z_1R_7R_8R_9)(Z_2R_{10}R_{11}R_{12})$; $A_1$, $A_2$, $Z_1$, or $Z_2$ are independently selected from a germanium, a tin, or a silicon; C=C is two carbons double bonded with each other and CC is two carbons triple-bonded with each other; and each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 21: The method, apparatus, or non-transitory computer-readable medium of any of aspects 15 through 20, where the first precursor is the alkene and includes the chemical formula $R_1R_2R_3A$-$CD_1$=$CD_2$-$ZR_4R_5R_6$, $R_1R_2R_3A$-$CD_1$=$CD_2$-$ZR_4R_5R_6$, $R_1R_2R_3A$-CC-$CD_1$=$CD_2$-$ZR_4R_5R_6$, $R_1R_2R_3A$-$CD_1$=$CD_2$-$ZR_4R_5R_6$, or $R_1R_2R_3A$-CC-$CD_1$=$CD_2$-CC—$ZR_4R_5R_6$; A or Z are independently selected from a germanium, a tin, or a silicon; CC is two carbons triple bonded with each other; C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 22: The method, apparatus, or non-transitory computer-readable medium of aspect 21, where $D_2$ includes the chemical formula $R_7R_8R_9A_2$, where $A_2$ is selected from a germanium, a tin, or a silicon, and where each of $R_7$, $R_8$, and $R_9$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 23: The method, apparatus, or non-transitory computer-readable medium of any of aspects 15 through 22, where the first precursor is the arene and includes the chemical formula the chemical formula $R_1R_2R_3A$-$C_6Y_1Y_2Y_3Y_4$—$ZR_4R_5R_6$, $R_1R_2R_3A$-CC—$C_6Y_1Y_2Y_3Y_4$—$ZR_4R_5R_6$, $R_1R_2R_3A$-CC—$C_6Y_1Y_2Y_3Y_4$—CC—$ZR_4R_5R_6$; each of A or Z are independently selected from a germanium, a tin, or a silicon; CC is two carbons triple-bonded with each other; C is a carbon and $Y_1$, $Y_2$, $Y_3$, and $Y_4$ are each independently selected from hydrogen (or deuterium), methyl, ethyl, propyl, isopropyl, a linear alkoxy, a branched alkoxy, or a hexyl alkoxy; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, . . . , $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, . . . , $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, . . . , $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 24: The method, apparatus, or non-transitory computer-readable medium of aspect 23, where $Y_1$ includes the chemical formula $R_7R_8R_9A_2$, or the chemical formula $R_7R_8R_9A_2$-CC; $Y_2$ includes the chemical formula $R_{10}R_{11}R_{12}A_3$, or the chemical formula $R_{10}R_{11}R_{12}A_3$-CC; $Y_3$ includes the chemical formula $R_{13}R_{14}R_{15}A_4$, or the chemical formula $R_{13}R_{14}R_{15}A_4$-CC; $Y_4$ includes the chemical formula $R_{16}R_{17}R_{18}A_5$, or the chemical formula $R_{16}R_{17}R_{18}A_5$-CC; or any combination thereof, where $A_2$, $A_3$, $A_4$, $A_5$ are independently selected from a germanium, a tin, or a silicon, and where $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 25: The method, apparatus, or non-transitory computer-readable medium of any of aspects 15 through 24, where the second, carbon-containing precursor includes the chemical formula $CX_1X_2X_3X_4$, or $W_1$=$CX_3X_4$, or $W_1$=C=$W_2$, or $NCX_3$, where each of $X_1$, $X_2$, $X_3$, and $X_4$ are independently selected from a fluoride; a chloride; a bromide; an iodide; a methoxy; an ethoxy; an alkoxy; an alkyl-sulfide; an alkyl-selenide; an alkyl-telluride; a cyanide; an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a dimethylamide; a diethylamide; an ethylmethylamide; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; hydrogen, deuterium; an alkyl; an aryl; an alkyl containing double or triple carbon-carbon bonds; or any combination thereof. Additionally, $W_1$ and $W_2$ are independently selected from oxygen, sulfur, selenium, or tellurium; examples of molecules containing $W_1$ and $W_2$ can be O=$CCl_2$, O=C=S, or S=C=S. Additionally, N is nitrogen; examples of molecules containing N can be NCBr, cyanogen bromide.

Aspect 26: The method, apparatus, or non-transitory computer-readable medium of any of aspects 15 through 25, where the second, carbon-containing precursor includes a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. The method, apparatus, or non-transitory computer-readable medium of any of aspects 14 through 23, where the second, carbon-containing may include an carboxylic acid halide, an halogenated carboxylic acid halide, a perhalogenated carboxylic acid halide, a di(carboxylic acid) di-halide, chloral. Examples of, respectively, each of these families can be formic acid chloride, HCOCl; chloroacetic acid chloride, $ClCH_2$—COCl; trifluoracetic acid chloride, $CF_3$—COCl; oxalic acid dichloride, ClOC—COCl; chloral, $CCl_3$—CHO. The method, apparatus, or non-transitory computer-readable medium of any of aspects 14 through 23, where the second, carbon-containing may include a carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, $ClCH_2$—COOH; trifluoracetic acid, $CF_3$—COOH; oxalic acid, HOOC—COOH; oxalic acid chloride, HOOC—COCl.

Aspect 27: The method, apparatus, or non-transitory computer-readable medium of any of aspects 15 through 26, where exposing the plurality of stacks of materials to the first precursor or exposing the plurality of stacks of materials to the second, carbon-containing precursor includes conducting the exposing at a temperature at or below 500° C., or at or below 400° C.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 28: An apparatus, including; a plurality of stacks of materials on a substrate, at least one material of the plurality of stacks of materials including a memory material; and a layer of carbon on the plurality of stacks of materials formed by exposing the plurality of stacks of materials to a first precursor that is an acetylene, a diacetylene, a triacetylene, a polyacetylene, an alkene, or an arene and that includes at least one of germanium, silicon, or tin and by exposing the plurality of stacks of materials to a second, carbon-containing precursor.

Aspect 29: The apparatus of aspect 28, further including; a second layer of carbon on the layer of carbon formed by exposing the layer of carbon to a third precursor to form a second carbon compound on the plurality of stacks of materials and exposing the second carbon compound to a fourth, carbon-containing precursor to form the second layer of carbon on the layer of carbon, wherein the third precursor is an acetylene, a diacetylene, a tri-acetylene, a polyacetylene, an alkene, or an arene and comprises at least one of germanium, silicon, or tin.

Aspect 30: The apparatus of aspect 29, further including; a set of carbon films, wherein each of the set of carbon films is associated with a precursor pair of a set of X precursor pairs, wherein each precursor pair of the set of X precursor pairs comprises one of a first set of precursors and one of a second set of precursors, wherein each precursors pair has an associated quantity of cycles, wherein each precursor of the first set of precursors is independently selected from an acetylene, a diacetylene, a tri-acetylene, a polyacetylene, an alkene, or an arene and comprises at least one of germanium, silicon, or tin, wherein each precursor of the second set of precursors is a carbon-containing precursor, and wherein each of the set of carbons films is formed by performing, according to the associated quantity of cycles for the associated precursor pair of the set of precursor pairs, an exposing with the one of the first set of precursors to form a respective carbon compound and an exposing of the respective carbon compound with the one of the second set of precursors to form one or more layers of carbon.

Aspect 31: The apparatus of aspects 28 through 30, where the first precursor is the acetylene and includes the chemical formula $R_1R_2R_3A$-CC—$ZR_4R_5R_6$, A or Z are independently selected from a germanium, a tin, or a silicon, CC is two carbons triple bonded with each other, and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 32: The apparatus of any of aspects 28 through 31, where the first precursor is the diacetylene, the tri-acetylene, the polyacetylene, and includes the chemical formula $R_1R_2R_3A$-CC—CC—$ZR_4R_5R_6$, $R_1R_2R_3A$-CC—CC—CC—$ZR_4R_5R_6$, or $R_1R_2R_3A$-$(CC)_n$—$ZR_4R_5R_6$, where n is greater than or equal to 4, A or Z are independently selected from a germanium, a tin, or a silicon, each CC is two carbons triple bonded with each other, and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 33: The apparatus of any of aspects 28 through 32, where the first precursor is the alkene and includes the chemical formula $(R_1R_2R_3A_1)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—$(Z_1R_7R_8R_9)(Z_2R_{10}R_{11}R_{12})$, $(R_1R_2R_3A_1$-CC$)(R_4R_5R_6A_2)$-C=C—(CC—$Z_1R_7R_8R_9)(Z_2R_{10}R_{11}R_{12})$, $R_1R_2R_3A_1$-CC$)(R_4R_5R_6A_2)$-C=C—(CC—$Z_1R_7R_8R_9)$(CC—$Z_2R_{10}R_{11}R_{12})$, or $(R_1R_2R_3A_1$-CC$)(R_4R_5R_6A_2$-CC$)$—C=C—$(Z_1R_7R_8R_9)(Z_2R_{10}R_{11}R_{12})$, $A_1$, $A_2$, $Z_1$, or $Z_2$ are independently selected from a germanium, a tin, or a silicon. C=C is two carbons double bonded with each other and CC is two carbons triple-bonded with each other, and each of $R_1$, $R_2$, $R_3$, $R_4$, $R_5$, $R_6$, $R_7$, $R_8$, $R_9$, $R_{10}$, $R_{11}$, and $R_{12}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 34: The apparatus of any of aspects 28 through 33, where the first precursor is the alkene and includes the chemical formula $R_1R_2R_3A\text{-}CD_1\!=\!CD_2\text{-}ZR_4R_5R_6$, $R_1R_2R_3A\text{-}CD_1\!=\!CD_2\text{-}ZR_4R_5R_6$, $R_1R_2R_3A\text{-}CC\text{-}CD_1\!=\!CD_2\text{-}ZR_4R_5R_6$. $R_1R_2R_3A\text{-}CD_1\!=\!CD_2\text{-}ZR_4R_5R_6$, or $R_1R_2R_3A\text{-}CC\text{-}CD_1\!=\!CD_2\text{-}CC\text{—}ZR_4R_5R_6$; A or Z are independently selected from a germanium, a tin, or a silicon; CC is two carbons triple bonded with each other; C is a carbon and each of $D_1$ and $D_2$ are independently selected from at least one of a hydrogen (or deuterium), an alkyl, an aryl, a methyl, an ethyl, a propyl, an iso-propyl, a linear alkyl-alkoxy, or a branched alkyl-alkoxy; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety, a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 35: The apparatus of aspect 34, where $D_2$ is selected from a germanium, a tin, or a silicon, and where each of $R_7$, $R_8$, and $R_9$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 36: The apparatus of any of aspects 28 through 35, where the first precursor is the arene and includes the chemical formula the chemical formula $R_1R_2R_3A-C_6Y_1Y_2Y_3Y_4-ZR_4R_5R_6$, $R_1R_2R_3A-CC-C_6Y_1Y_2Y_3Y_4-ZR_4R_5R_6$, $R_1R_2R_3A-CC-C_6Y_1Y_2Y_3Y_4-CC-ZR_4R_5R_6$; each of A or Z are independently selected from a germanium, a tin, or a silicon; CC is two carbons triple-bonded with each other; C is a carbon and $Y_1$, $Y_2$, $Y_3$, and $Y_4$ are each independently selected from hydrogen (or deuterium), methyl, ethyl, propyl, isopropyl, a linear alkoxy, a branched alkoxy, or a hexyl alkoxy; and each of $R_1$, $R_2$, $R_3$, $R_4$, $R_5$, and $R_6$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate, an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of R is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate, an isotellurocyanate; an azide; a fulminate; or an isofulminate.

Aspect 37: The apparatus of aspect 36, where $Y_1$ includes the chemical formula $R_7R_8R_9A_2$, or the chemical formula $R_7R_8R_9A_2$-CC; $Y_2$ includes the chemical formula $R_{10}R_{11}R_{12}A_3$, or the chemical formula $R_{10}R_{11}R_{12}A_3$-CC; $Y_3$ includes the chemical formula $R_{13}R_{14}R_{15}A_4$, or the chemical formula $R_{13}R_{14}R_{15}A_4$-CC; $Y_4$ includes the chemical formula $R_{16}R_{17}R_{18}A_5$, or the chemical formula $R_{16}R_{17}R_{18}A_5$-CC; or any combination thereof, where $A_2$, $A_3$, $A_4$, $A_5$ are independently selected from a germanium, a tin, or a silicon, and where $R_7$, $R_8$, $R_9$, $R_{10}$, $R_{11}$, $R_{12}$, $R_{13}$, $R_{14}$, $R_{15}$, $R_{16}$, $R_{17}$, and $R_{18}$ are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a —$SiR_aR_bR_c$ moiety; a —$GeR_aR_bR_c$ moiety; a —$SnR_aR_bR_c$ moiety; a —$SiR_aR_bCR_cR_dR_e$ moiety; a —$CR_aR_bSiR_cR_dR_e$ moiety; a —$SiR_aR_bGeR_cR_dR_e$ moiety; or a moiety containing a set of carbon atoms, silicon atoms, germanium atoms, tin atoms, or any combination thereof each fully saturated with respective substituents $R_a$, $R_b$, $R_c$, $R_d$, $R_e$, ..., $R_x$ and comprising 1 to 10 carbon atoms, silicon atoms, germanium atoms, tin atoms, or any combination thereof distinct from any carbon, silicon, germanium, or tin within the respective substituents $R_a$, $R_b$, $R_c$, $R_d$, $R_e$, ..., $R_x$, wherein x of $R_x$ is an index different than a of $R_a$, wherein the set of carbon atoms, silicon atoms, germanium atoms, tin atoms, or any combination thereof is linear, branched, or cyclic; and wherein $R_a$, $R_b$, $R_c$, $R_d$, $R_e$, ..., $R_x$ is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

Aspect 37: The apparatus of any of aspects 28 through 36, where the second, carbon-containing precursor includes the chemical formula $CX_1X_2X_3X_4$, or $W_1=CX_3X_4$, or $W_1=C=W_2$, or $NCX_3$, each of $X_1$, $X_2$, $X_3$, and $X_4$ are independently selected from a fluoride; a chloride; a bromide; an iodide; a methoxy; an ethoxy; an alkoxy; an alkyl-sulfide; an alkyl-selenide; an alkyl-telluride; a cyanide; an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a dimethylamide; a diethylamide; an ethylmethylamide; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; hydrogen, deuterium; an alkyl; an aryl; an alkyl containing double or triple carbon-carbon bonds; or any combination thereof. Additionally, $W_1$ and $W_2$ are independently selected from oxygen, sulfur, selenium, or tellurium; examples of molecules containing $W_1$ and $W_2$ can be $O=CCl_2$, $O=C=S$, or $S=C=S$. Additionally, N is nitrogen; examples of molecules containing N can be NCBr, cyanogen bromide.

Aspect 38: The apparatus of any of aspects 28 through 37, where the second, carbon-containing precursor includes a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, carbon monoxide, or any combination thereof. The apparatus of any of aspects 26 through 35, where the second, carbon-containing may include an carboxylic acid halide, an halogenated carboxylic acid halide, a perhalogenated carboxylic acid halide, a di(carboxylic acid) di-halide, chloral. Examples of, respectively, each of these families can be formic acid chloride, HCOCL; chloroacetic acid chloride, $ClCH_2$—COCl; trifluoroacetic acid chloride, $CF_3$—COCl; oxalic acid dichloride, ClOC—COCl; chloral, $CCl_3$—CHO. The apparatus of any of aspects 26 through 35, where the second, carbon-containing may include a carboxylic acid, an halogenated carboxylic acid, a perhalogenated carboxylic acid, a di-carboxylic acid, or a molecule having a carboxylic acid functional group and a carboxylic acid halide functional group. Examples of, respectively, each of these families can be formic acid, HCOOH; chloroacetic acid, $ClCH_2$—COOH; trifluoroacetic acid, $CF_3$—COOH; oxalic acid, HOOC—COOH; oxalic acid chloride, HOOC—COCl.

Aspect 39: The apparatus of any of aspects 28 through 38, where exposing the plurality of stacks of materials to the first precursor or exposing the plurality of stacks of materials to the second, carbon-containing precursor includes conducting the exposing at a temperature at or below 500° C.

Aspect 40: The apparatus of any of aspects 28 through 39, where the temperature is at or below 400° C.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99% met, or at least 99.9% met.

As used herein, spatially relative terms, such as "adjacent," "beneath," "below," "lower," "bottom," "above," "upper," "top," "front," "rear," "left," "right," and the like, may be used for ease of description to describe one element's or feature's relationship to another element (s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one or ordinary skill in the art. The materials may be otherwise oriented (e.g., rotated 90 degrees, inverted, flipped), and the spatially relative descriptors used herein interpreted accordingly.

As used herein, the term "electronic device" may include, without limitation, a memory device, as well as semiconductor devices, which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as a 3D dynamic random access memory (DRAM) memory device, a 3D crosspoint memory device, or a 3D phase-change random access memory (PCRAM) memory device.

As used herein, the term "substrate" means and includes a foundation material or construction upon which components, such as those within a semiconductor device or electronic device are formed. The substrate may be a semiconductor substrate, a base material, a base semiconductor material on a supporting structure, a metal electrode, or a semiconductor substrate having one or more materials, structures, or regions formed thereon. The substrate may be a conventional silicon substrate, or other bulk substrate including a semiconductive material. As used herein, the term "bulk substrate" means and includes not only silicon wafers, but also silicon-on insulator ("SOI") substrates, such as silicon-on-sapphire ("SOS") substrates or silicon-onglass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
reacting a first precursor with a base material to form a carbon compound on the base material, wherein the first precursor includes at least one alkyne group and comprises silicon; and
reacting a second, carbon-containing precursor with the carbon compound to form a first layer of pure carbon on the base material.

2. The method of claim 1, further comprising:
reacting a third precursor with the first layer of pure carbon to form a second carbon compound on the first layer of pure carbon, wherein the third precursor includes at least one alkyne group and comprises silicon; and
reacting a fourth, carbon-containing precursor with the second carbon compound to form a second layer of pure carbon on the first layer of pure carbon.

3. The method of claim 2, further comprising:
identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors includes at least one alkyne group and comprises silicon, and wherein each precursor of the second set of precursors is a carbon-containing precursor; and
performing, according to the associated quantity of cycles for each precursor pair of the set of X precursor pairs and to form a respective carbon film associated with the precursor pair, a reacting of the one of the first set of precursors to form a respective carbon compound and a reacting of the one of the second set of precursors with the respective carbon compound to form one or more layers of pure carbon.

4. The method of claim 1, wherein
the first precursor is an acetylene and comprises the chemical formula R1R2R3A-CC-ZR4R5R6, wherein
A or Z are a silicon,
CC is two carbons triple bonded with each other, and
each of R1, R2, R3, R4, R5, and R6 are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a -SiRaRbRc moiety; a -GeRaRbRc moiety; a -SnRaRbRc moiety; a -SiRaRbCRcRdRe moiety; a -CRaRbSiRcRdRe moiety; a -SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

5. The method of claim 1, wherein
the first precursor is a diacetylene or a tri-acetylene, and comprises the chemical formula R1R2R3A-CC-CC-ZR4R5R6, R1R2R3A-CC-CC-CC-ZR4R5R6, or R1R2R3A-(CC)n-ZR4R5R6, wherein n is greater than or equal to 4, wherein
A or Z are a silicon,
each CC is two carbons triple bonded with each other, and
each of R1, R2, R3, R4, R5, and R6 are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a -SiRaRbRc moiety; a -GeRaRbRc moiety; a -SnRaRbRc moiety; a-SiRaRbCRcRdRe moiety; a-CRaRbSiRcRdRe moiety; a-SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

6. The method of claim 1, wherein
the second, carbon-containing precursor comprises the chemical formula CX1X2X3X4, or W1=CX3X4, or W1=C=W2, or NCX3, wherein
each of W1 and W2 are independently selected from oxygen, sulfur, selenium, or tellurium,
N is nitrogen, and
each of X1, X2, X3, and X4 are independently selected from a fluoride; a chloride; a bromide; an iodide; a methoxy; an ethoxy; an alkoxy; an alkyl-sulfide; an alkyl-selenide; an alkyl-telluride; a cyanide; an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a dimethylamide; a diethylamide; an ethylmethylamide; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; hydrogen, deuterium; an alkyl; an aryl; an alkyl containing double or triple carbon-carbon bonds; or any combination thereof.

7. The method of claim 1, wherein the second, carbon-containing precursor comprises a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, a carboxylic acid halide, an halogenated carboxylic acid halide, a perhalogenated carboxylic acid halide, a di(carboxylic acid) di-halide, a carboxylic acid, an halogenated carboxylic acid, a perhalogenated carboxylic acid, a di-carboxylic acid, a molecule having a carboxylic acid functional group and a carboxylic acid halide functional group, chloral, carbon monoxide, or any combination thereof.

8. The method of claim 1, wherein reacting the first precursor with the base material or reacting the second, carbon-containing precursor with the carbon compound to form the first layer of pure carbon comprises conducting the reacting at a temperature at or below 500° C.

9. The method of claim 8, wherein the temperature is at or below 400° C.

10. A method, comprising:
forming a plurality of stacks of materials on a substrate;
exposing the plurality of stacks of materials to a first precursor to form a carbon compound on the plurality of stacks of materials, wherein the first precursor includes at least one alkyne group and comprises silicon; and
exposing the plurality of stacks to a second, carbon-containing precursor to form a layer of pure carbon on the plurality of stacks of materials.

11. The method of claim 10, further comprising:
exposing the layer of pure carbon to a third precursor to form a second carbon compound on the plurality of stacks of materials, wherein the third precursor includes at least one alkyne group and comprises silicon; and
exposing the second carbon compound to a fourth, carbon-containing precursor to form a second layer of pure carbon on the layer of carbon.

12. The method of claim 11, further comprising:
identifying a set of X precursor pairs, wherein each precursor pair of the set of X precursor pairs comprises one of a first set of precursors and one of a second set of precursors, wherein each precursor pair has an associated quantity of cycles, wherein X is an integer greater than or equal to 2, wherein each precursor of the first set of precursors includes at least one alkyne group and comprises silicon, and wherein each precursor of the second set of precursors is a carbon-containing precursor; and
performing, according to the associated quantity of cycles for each precursor pair of the set of X precursor pairs and to form a respective carbon film associated with the precursor pair, an exposing with the one of the first set of precursors to form a respective carbon compound and an exposing of the respective carbon compound with the one of the second set of precursors to form one or more layers of pure carbon.

13. The method of claim 10, wherein
the first precursor is an acetylene and comprises the chemical formula R1R2R3A-CC-ZR4R5R6, wherein
A or Z are a silicon,
CC is two carbons triple bonded with each other, and
each of R1, R2, R3, R4, R5, and R6 are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a -SiRaRbRc moiety; a -GeRaRbRc moiety; a -SnRaRbRc moiety; a -SiRaRbCRcRdRe moiety; a -CRaRbSiRcRdRe moiety; a -SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

14. The method of claim 10, wherein
the first precursor is a diacetylene or a tri-acetylene, and comprises the chemical formula R1R2R3A-CC-CC-ZR4R5R6, R1R2R3A-CC-CC-CC-ZR4R5R6, or R1R2R3A-(CC)n-ZR4R5R6, wherein n is greater than or equal to 4, wherein
A or Z are a silicon,
each CC is two carbons triple bonded with each other, and
each of R1, R2, R3, R4, R5, and R6 are independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; an isofulminate; a -SiRaRbRc moiety; a -GeRaRbRc moiety; a -SnRaRbRc moiety; a -SiRaRbCRcRdRe moiety; a -CRaRbSiRcRdRe moiety; a -SiRaRbGeRcRdRe moiety; or a moiety containing a set of carbon atoms, silicon atoms, germanium atoms, tin atoms, or any combination thereof each fully saturated with respective substituents Ra, Rb, Rc, Rd, Re, . . . , Rx and comprising 1 to 10 carbon atoms, silicon atoms, germanium atoms, tin atoms, or any combination thereof distinct from any carbon, silicon, germanium, or tin within the respective substituents Ra, Rb, Rc, Rd, Re, . . . , Rx, wherein x of Rx is an index different than a of Ra, wherein the set of carbon atoms, silicon atoms, germanium atoms, tin atoms, or any combination thereof is linear, branched, or cyclic; and wherein Ra, Rb, Rc, Rd, Re, . . . , Rx is independently selected from hydrogen; deuterium; an alkyl group; an aryl group; an alkoxy; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; an alkyl-sulfide; an alkyl-selenide; a halide; an alkyl-telluride; a cyanide, an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate.

15. The method of claim 10, wherein
the second, carbon-containing precursor comprises the chemical formula CX1X2X3X4, or W1=CX3X4, or W1=C=W2, or NCX3, wherein
each of W1 and W2 are independently selected from oxygen, sulfur, selenium, or tellurium,
N is nitrogen, and
each of X1, X2, X3, and X4 are independently selected from a fluoride; a chloride; a bromide; an iodide; a methoxy; an ethoxy; an alkoxy; an alkyl-sulfide; an alkyl-selenide; an alkyl-telluride; a cyanide; an isocyanide; a cyanate; an isocyanate; a thiocyanate; an isothiocyanate; a selenocyanate; an isoselenocyanate; a tellurocyanate; an isotellurocyanate; an azide; a fulminate; or an isofulminate; a dimethylamide; a diethylamide; an ethylmethylamide; a di-alkylamide; an amide with an alkyl and a silyl substituent, wherein the silyl substituent has hydrogen, deuterium or alkyl substituents; an amide with two silyl substituents, wherein the two silyl substituents have hydrogen, deuterium or alkyl substituents; an amide with an alkyl and a germyl substituent, wherein the germyl substituent has hydrogen, deuterium or alkyl substituents; a tri-alkylhydrazide; a hydrazide with a combination of three substituents selected from alkyl, silyl, or germyl, wherein the silyl or the germyl have hydrogen, deuterium or alkyl substituents; hydrogen, deuterium; an alkyl; an aryl; an alkyl containing double or triple carbon-carbon bonds; or any combination thereof.

16. The method of claim 10, wherein the second, carbon-containing precursor comprises a perhalogenated alkane, a perhalogenated alkene, a perhalogenated alkyne, a perhalogenated ethylene, a perhalogenated benzene, a perhalogenated toluene, a perhalogenated arene, a difluoroacetylene, a dichloroacetylene, a dibromoacetylene, a diiodoacetylene, a carboxylic acid halide, an halogenated carboxylic acid halide, a perhalogenated carboxylic acid halide, a di(carboxylic acid) di-halide, a carboxylic acid, an halogenated carboxylic acid, a perhalogenated carboxylic acid, a di-carboxylic acid, a molecule having a carboxylic acid functional group and a carboxylic acid halide functional group, chloral, carbon monoxide, or any combination thereof.

17. The method of claim 10, wherein exposing the plurality of stacks of materials to the first precursor or exposing the plurality of stacks of materials to the second, carbon-containing precursor comprises conducting the exposing at a temperature at or below 500° C.

18. The method of claim 17, wherein the temperature is at or below 400° C.

* * * * *